United States Patent
Yamazaki et al.

(10) Patent No.: US 8,581,234 B2
(45) Date of Patent: Nov. 12, 2013

(54) DEPOSITION METHOD AND MANUFACTURING METHOD OF LIGHT-EMITTING DEVICE

(75) Inventors: Shunpei Yamazaki, Tokyo (JP); Koichiro Tanaka, Kanagawa (JP); Takahiro Ibe, Kanagawa (JP); Satoshi Seo, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 189 days.

(21) Appl. No.: 12/391,785

(22) Filed: Feb. 24, 2009

(65) Prior Publication Data

US 2009/0221107 A1    Sep. 3, 2009

(30) Foreign Application Priority Data

Feb. 29, 2008  (JP) ................... 2008-051256

(51) Int. Cl.
*H01L 33/02*  (2010.01)

(52) U.S. Cl.
USPC ............................................. 257/29

(58) Field of Classification Search
USPC ........ 438/22, 29, 758; 257/E33.001, E21.211
See application file for complete search history.

(56) References Cited

U.S. PATENT DOCUMENTS

| | | | |
|---|---|---|---|
| 5,851,709 A | 12/1998 | Grande et al. | |
| 5,937,272 A | 8/1999 | Tang | |
| 6,165,543 A | 12/2000 | Otsuki et al. | |
| 6,283,060 B1 | 9/2001 | Yamazaki et al. | |
| 6,566,032 B1 | 5/2003 | Boroson et al. | |
| 6,610,455 B1 | 8/2003 | Burberry et al. | |
| 6,689,492 B1 | 2/2004 | Yamazaki et al. | |
| 6,695,029 B2 | 2/2004 | Phillips et al. | |

(Continued)

FOREIGN PATENT DOCUMENTS

| EP | 0 883 190 A2 | 12/1998 |
|---|---|---|
| EP | 1 003 354 A1 | 5/2000 |

(Continued)

OTHER PUBLICATIONS

Urabe, T. et al, "13.1: Invited Paper: Technological Evolution for Large Screen Size Active Matrix OLED Display," SID '07 Digest: SID International Symposium Digest of Technical Papers, vol. 38, 2007, pp. 161-164.

(Continued)

*Primary Examiner* — Jarrett Stark
*Assistant Examiner* — Michele Fan
(74) *Attorney, Agent, or Firm* — Husch Blackwell LLP

(57) ABSTRACT

Part of a material layer is deposited on a deposition target surface of a second substrate by steps of providing a first substrate having a light absorption layer and a material layer in contact with the light absorption layer over one of surfaces; making a surface of the first substrate over which the material layer is formed and a deposition target surface of a second substrate face to each other; depositing part of the material layer on the deposition target surface of the second substrate in such a manner that irradiation with laser light of which repetition rate is greater than or equal to 10 MHz and pulse width is greater than or equal to 100 fs and less than or equal to 10 ns is performed from the other surface side of the first substrate to selectively heat part of the material layer overlapping with the light absorption layer.

32 Claims, 16 Drawing Sheets

(56) References Cited

U.S. PATENT DOCUMENTS

| | | |
|---|---|---|
| 6,703,179 B2 | 3/2004 | Tyan |
| 6,776,847 B2 | 8/2004 | Yamazaki et al. |
| 6,811,938 B2 | 11/2004 | Tutt et al. |
| 7,223,514 B2 | 5/2007 | Kang et al. |
| 7,265,489 B2 | 9/2007 | Yamasaki et al. |
| 7,316,983 B2 | 1/2008 | Yamazaki et al. |
| 7,378,711 B2 | 5/2008 | Suh et al. |
| 2003/0064248 A1 | 4/2003 | Wolk et al. |
| 2003/0068525 A1 | 4/2003 | Bellmann et al. |
| 2003/0162108 A1* | 8/2003 | Burberry et al. ............ 430/20 |
| 2004/0028942 A1* | 2/2004 | Culver et al. ............ 428/690 |
| 2004/0065902 A1 | 4/2004 | Yamazaki et al. |
| 2004/0121068 A1 | 6/2004 | Bellmann et al. |
| 2004/0161696 A1 | 8/2004 | Hsu et al. |
| 2004/0191564 A1 | 9/2004 | Kim et al. |
| 2004/0217695 A1 | 11/2004 | Yoneda et al. |
| 2005/0005848 A1 | 1/2005 | Yamazaki et al. |
| 2005/0145326 A1 | 7/2005 | Hatwar |
| 2005/0157157 A1 | 7/2005 | Tsukamoto et al. |
| 2006/0008577 A1 | 1/2006 | Wolk et al. |
| 2006/0073406 A1 | 4/2006 | Kang et al. |
| 2006/0084006 A1 | 4/2006 | Kang et al. |
| 2006/0127797 A1 | 6/2006 | Bellmann et al. |
| 2006/0163743 A1 | 7/2006 | Kuwabara et al. |
| 2006/0233950 A1 | 10/2006 | Kim et al. |
| 2006/0243377 A1 | 11/2006 | Matsuo et al. |
| 2006/0246240 A1 | 11/2006 | Matsuda et al. |
| 2006/0246693 A1 | 11/2006 | Tanaka et al. |
| 2007/0045621 A1 | 3/2007 | Suzuki et al. |
| 2007/0057264 A1* | 3/2007 | Matsuda ............ 257/88 |
| 2007/0080634 A1 | 4/2007 | Wolk |
| 2008/0007166 A1 | 1/2008 | Bellmann et al. |
| 2008/0026543 A1* | 1/2008 | Miyairi et al. ............ 438/455 |
| 2008/0050851 A1 | 2/2008 | Tanaka et al. |
| 2008/0050895 A1 | 2/2008 | Miyairi et al. |
| 2008/0057618 A1 | 3/2008 | Honda et al. |
| 2008/0057632 A1 | 3/2008 | Arai et al. |
| 2008/0069980 A1 | 3/2008 | Bellmann et al. |
| 2008/0070393 A1 | 3/2008 | Miyairi et al. |
| 2008/0081115 A1 | 4/2008 | Yamazaki et al. |
| 2008/0113292 A1* | 5/2008 | Matsuo ............ 430/270.1 |
| 2008/0124647 A1* | 5/2008 | Matsuda et al. ............ 430/270.1 |
| 2008/0124850 A1 | 5/2008 | Takayama et al. |
| 2008/0182207 A1 | 7/2008 | Yamazaki et al. |
| 2008/0182349 A1 | 7/2008 | Yamazaki et al. |
| 2008/0227232 A1 | 9/2008 | Yamazaki et al. |
| 2008/0299496 A1 | 12/2008 | Hirakata et al. |
| 2008/0305287 A1 | 12/2008 | Ohata et al. |
| 2009/0073325 A1 | 3/2009 | Kuwabara et al. |
| 2009/0075214 A1 | 3/2009 | Hirakata et al. |
| 2009/0104403 A1 | 4/2009 | Aoyama et al. |
| 2009/0104721 A1 | 4/2009 | Hirakata et al. |
| 2009/0104835 A1 | 4/2009 | Aoyama et al. |
| 2009/0142510 A1 | 6/2009 | Takahashi et al. |
| 2009/0153762 A1 | 6/2009 | Kuwabara et al. |
| 2009/0166563 A1 | 7/2009 | Yokoyama et al. |
| 2009/0169809 A1 | 7/2009 | Yokoyama et al. |
| 2009/0197017 A1 | 8/2009 | Tanaka et al. |

FOREIGN PATENT DOCUMENTS

| | | |
|---|---|---|
| EP | 1 176 642 A2 | 1/2002 |
| EP | 1 624 485 A2 | 2/2006 |
| EP | 1 646 094 A1 | 4/2006 |
| EP | 1 650 046 A1 | 4/2006 |
| EP | 1 760 776 A2 | 3/2007 |
| EP | 1 787 822 A2 | 5/2007 |
| JP | 11-54275 | 2/1999 |
| JP | 11-260549 | 9/1999 |
| JP | 2000-256877 | 9/2000 |
| JP | 2004-103406 | 4/2004 |
| JP | 2005-500652 | 1/2005 |
| JP | 2006-108098 | 4/2006 |
| JP | 2006-123546 | 5/2006 |
| JP | 2006-229212 | 8/2006 |
| JP | 2006-302865 | 11/2006 |
| JP | 2006-309995 | 11/2006 |
| JP | 2007-96276 | 4/2007 |
| JP | 2007-141702 | 6/2007 |
| WO | WO 03/017731 A1 | 2/2003 |
| WO | WO 03/017732 A1 | 2/2003 |

OTHER PUBLICATIONS

International Search Report re application No. PCT/JP2009/052943, dated Jun. 2, 2009.
Written Opinion re application No. PCT/JP2009/052943, dated Jun. 2, 2009.

* cited by examiner

FIG. 10A
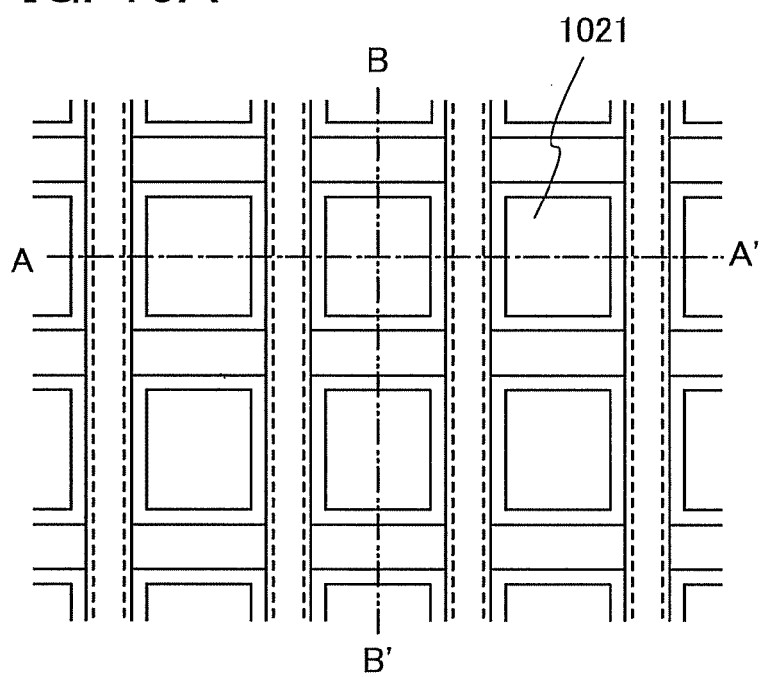
FIG. 10C
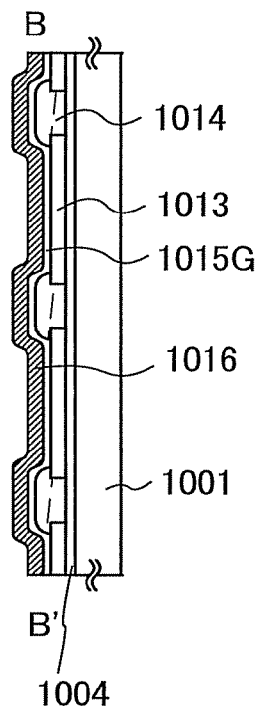
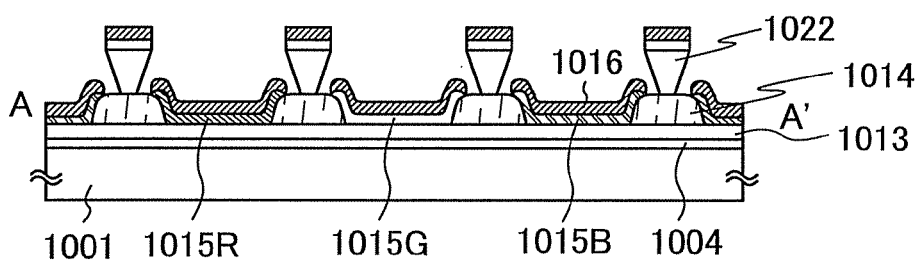
FIG. 10B

DEPOSITION METHOD AND MANUFACTURING METHOD OF LIGHT-EMITTING DEVICE

TECHNICAL FIELD

The present invention relates to a deposition method and a manufacturing method of a light-emitting device using the deposition method.

BACKGROUND ART

A light-emitting element using an organic compound as a luminous body, which has features such as thinness, lightness, high-speed response, and DC drive at low voltage, is expected to be applied to a next-generation flat panel display. In particular, a display device in which light-emitting elements are arranged in matrix is considered to have advantages in a wide viewing angle and excellent visibility over a conventional liquid crystal display device.

It is said that, as for a light-emitting mechanism of a light-emitting element, an EL layer is interposed between a pair of electrodes and voltage is applied to the EL layer, so that electrons injected from a cathode and holes injected from an anode are recombined in an emission center of the EL layer to form molecular excitons, and the molecular excitons release energy when returning to a ground state; thus, light is emitted. Singlet excitation and triplet excitation are known as excitation states, and it is considered that light can be emitted through either of the two excitation states.

An EL layer included in a light-emitting element includes at least a light-emitting layer. In addition, the EL layer can have a stacked-layer structure including a hole-injecting layer, a hole-transporting layer, an electron-transporting layer, an electron-injecting layer, and/or the like, in addition to the light-emitting layer.

EL materials for forming an EL layer are broadly classified into a low molecular (monomer) material and a high molecular (polymer) material. In general, a low molecular material is often deposited by an evaporation method and a high molecular material is often deposited by an inkjet method, a spin coating method, or the like.

An evaporation apparatus which is used for an evaporation method has a substrate holder to which a substrate is mounted; a crucible (or an evaporation boat) containing an EL material, that is, an evaporation material; a heater for heating the EL material in the crucible; and a shutter for preventing the EL material from being scattered during sublimation. The EL material which is heated by the heater is sublimed and deposited on the substrate. In order to achieve uniform deposition, a deposition target substrate needs to be rotated and the distance between the substrate and the crucible needs to be about 1 m even when the substrate has a size of 300 mm×360 mm. Accordingly, when a substrate to be processed is larger, an evaporation apparatus also needs to be larger; therefore, it can be thought that there is practically a limitation on the size of a substrate on which deposition can be performed by an evaporation method.

When an evaporation method is employed to manufacture a full-color display device using light emitting elements of red, green, and blue, a shadow mask is provided between the substrate and an evaporation source so as to be in contact with the substrate, and selective coloring can be achieved with this shadow mask.

However, the shadow mask which is used for manufacturing the full-color display device is extremely thin since it is necessary to precisely manufacture an opening. Therefore, when the shadow mask size is increased in accordance with an increase in a substrate size, there have been problems of bending of the shadow mask, changing of the size of the opening, and the like. Furthermore, since it is difficult to introduce a means for reinforcing the strength of the shadow mask in a region which corresponds to a pixel portion of the shadow mask, in the case of manufacturing a display region having a large area, application of a reinforcing means is also difficult.

Further, miniaturization of each display pixel pitch is increasingly demanded with high definition of a display device (increase in the number of pixels), and the shadow mask tends to be thin.

On the other hand, a wet process such as an ink-jet method or a spin coating method can be used even when a substrate is larger; however, it is difficult to form an even film. Further, when a wet process is used, after application of a composition or a solution containing an EL material, a baked solvent needs to be removed. Accordingly, when layers containing an EL material are stacked, repetition of an application step and a baking step is needed, which takes much time. Further, when a layer is stacked by a wet process such as an ink-jet method, deposition has to be performed using a solvent which does not dissolve a layer which has already been formed, and the selection range of materials to be used or stacked-layer structures is limited. When the selection range of materials to be used or stacked-layer structures is limited, performance of a light-emitting element (luminous efficiency, lifetime, or the like) is extremely limited. Accordingly, a large defect is caused in improvement in performance of a light-emitting device, such as being unable to apply a light-emitting element having an excellent structure to a light-emitting device.

Thus, a method for forming an EL layer of a light-emitting element through laser thermal transfer has been proposed (see Patent Document 1: Japanese Published Patent Application No. 2006-309995). Patent Document 1 discloses a transfer substrate which has a photothermal conversion layer including a low-reflective layer and a high-reflective layer and a transfer layer over a supporting substrate. Irradiation of such a transfer substrate with laser light allows the transfer layer to be transferred to an element-forming substrate.

DISCLOSURE OF INVENTION

However, the high-reflective layer and the low-reflective layer of the transfer substrate of Patent Document 1 are stacked on one side of the substrate. Therefore, even with the use of the high-reflective layer, a certain degree of heat absorption is conceivable. Thus, when the energy power of laser light is large, not only a portion of the transfer layer over the low-reflective layer but also a portion of the transfer layer over the high-reflective layer might be transferred.

Further, in the structure illustrated in FIG. 3 of Patent Document 1, as described in [0041], a gap should not be generated between the low-reflective layer and the high-reflective layer, and thus high-accuracy patterning is needed.

Further, in the structure illustrated in FIG. 7 of Patent Document 1, the low-reflective layer is patterned, the high-reflective layer is then formed over the entire surface, and the transfer layer is then formed. In this structure, heat from the low-reflective layer which is heated by absorption of laser light is transferred to the transfer layer through the high-reflective layer. Thus, not only a desired portion of the transfer layer but also the transfer layer around the desired portion might be transferred.

Thus, it is an object of the present invention to enable deposition of only a material in a desired region and to enable formation of a minute pattern.

It is another object of the present invention to improve productivity by reduction in time taken for deposition.

One feature of the present invention is a deposition method including the steps of providing a first substrate having a light absorption layer and a material layer which is formed so as to be in contact with the light absorption layer over one of surfaces; making a surface of the first substrate over which the material layer is formed and a deposition target surface of a second substrate face to each other; depositing part of the material layer on the deposition target surface of the second substrate in such a manner that irradiation with laser light of which repetition rate is greater than or equal to 10 MHz and pulse width is greater than or equal to 100 fs and less than or equal to 10 ns is performed from the other surface side of the first substrate to selectively heat part of the material layer which overlaps with the light absorption layer.

Further, another feature of the present invention is a manufacturing method of a light-emitting device using the above-described deposition method. Accordingly, the feature of the present invention is a manufacturing method of a light-emitting device including steps of providing a first substrate having a light absorption layer and a material layer which is formed so as to be in contact with the light absorption layer over one of surfaces; making one of surfaces of the first substrate over which the material layer is formed and one of surfaces of a second substrate on which a first electrode is formed face to each other; and depositing part of the material layer on the first electrode of the second substrate in such a manner that irradiation with laser light of which repetition rate is greater than or equal to 10 MHz and pulse width is greater than or equal to 100 fs and less than or equal to 10 ns is performed from the other of the surfaces of the first substrate to selectively heat part of the material layer which overlaps with the light absorption layer.

Moreover, in the above-described structure, the light absorption layer has a reflectance of less than or equal to 70% with respect to light. Note that the thickness of the light absorption layer is greater than or equal to 10 nm and less than or equal to 600 nm. Further, the light absorption layer contains any of metal nitride, metal and carbon.

Note that, in the above-described structures, the light absorption layer is formed into an island shape. Alternatively, the light absorption layer is formed in stripes.

Furthermore, in the above-described structures, the material layer is preferably formed using an organic compound. Note that a case where the material layer contains either one or both of a light-emitting material and a carrier-transporting material is also included in the present invention. Further, the material layer is preferably formed by a wet process.

Furthermore, in the above-described structures, the laser light is preferably shaped into linear or rectangular laser light.

Further, the present invention includes, in its category, an electronic device including a light-emitting device as well as a light-emitting device including a light-emitting element. Therefore, a light-emitting device in this specification refers to an image display device, a light-emitting device, and a light source (including an illumination device in its category). Further, the light-emitting device includes any of the following modules in its category: a module in which a connector such as a flexible printed circuit (FPC), tape automated bonding (TAB) tape, or a tape carrier package (TCP) is attached to a light-emitting device; a module having TAB tape or a TCP provided with a printed wiring board at the end thereof; and a module having an integrated circuit (IC) directly mounted on a light-emitting element by a chip on glass (COG) method.

Application of the present invention makes it possible to form a flat even film. In addition, such a film can be deposited on only a desired region, and thus a minute pattern can be formed.

Application of the present invention makes it possible to form a minute pattern, and thus, high-definition light-emitting device can be manufactured.

Application of the present invention also makes it possible to reduce the time taken for deposition, which can lead to increase in productivity.

BRIEF DESCRIPTION OF THE DRAWINGS

In the accompanying drawings:

FIGS. 10A to 10C are views illustrating a passive matrix light-emitting device;

BEST MODE FOR CARRYING OUT THE INVENTION

Figure 1A:
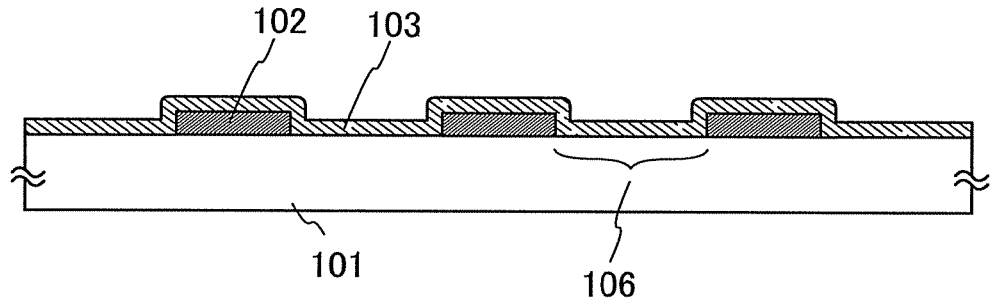
FIGS. 1A to 1C are views illustrating a deposition substrate and a deposition method of the present invention.

Embodiment Modes and Embodiment of the present invention will be hereinafter described in detail with reference to the accompanying drawings. Note that the present invention is not limited to the description below and the modes and details of the present invention can be modified in various ways without departing from the purpose and scope of the present invention. Therefore, the present invention should not be interpreted as being limited to the description below of Embodiment Modes and Embodiment. In the structure of the present invention hereinafter described, reference numerals indicating the same portions are used in common in different drawings.

Embodiment Mode 1

In this embodiment mode, a deposition substrate of the present invention and a deposition method using the deposition substrate will be described. Note that a case where an EL layer of a light-emitting element is formed using a deposition substrate will be described in this embodiment mode. In this specification, a substrate in which a material that is desired to be deposited is provided and which is used for deposition on a deposition target substrate is denoted as a "deposition substrate" hereinafter.

FIG. 1A illustrates an example of a deposition substrate. As illustrated in FIG. 1A, a light absorption layer 102 is formed over a first substrate 101 which is a supporting substrate. The light absorption layer 102 is patterned so as to correspond to a region of the deposition target substrate on which deposition is desired to be performed. In FIG. 1A, the light absorption layer 102 is formed so as to have an opening 106. A material layer 103 containing a material to be deposited on the deposition target substrate is formed over the light absorption layer 102. In FIG. 1A, the material layer 103 is formed over the entire surface of the first substrate 101.

Note that in the present invention, since light which is delivered to the first substrate 101 at the time of deposition of the material contained in the material layer should be transmitted through the first substrate 101, the first substrate 101 preferably has a high light transmittance. That is, in the case of using laser light as the irradiation light, a substrate which transmits laser light is preferably used as the first substrate 101. In addition, the first substrate 101 is preferably formed using a material having low thermal conductivity. With the first substrate 101 having low thermal conductivity, heat obtained from the irradiation light can be efficiently used for deposition. As the first substrate 101, for example, a glass substrate, a quartz substrate, or the like can be used. Impurities (moisture or the like) are not likely to be adsorbed on or attached to a glass substrate, a quarts substrate, or the like as compared to a film substrate or the like. Accordingly, at the time of deposition, an impurity can be prevented from entering.

The light absorption layer 102 absorbs light which is emitted at the time of deposition. Therefore, it is preferable the light absorption layer 102 be formed using a material which has low reflectance and high absorptance with respect to the irradiation light. Specifically, it is preferable that the light absorption layer 102 have a reflectance of less than or equal to 70% with respect to the irradiation light.

Any of a variety of kinds of materials can be used for the light absorption layer 102. For example, metal nitride such as titanium nitride, tantalum nitride, molybdenum nitride, or tungsten nitride, metal such as titanium, molybdenum, or tungsten, carbon, or the like can be used. Note that since a kind of material which is suitable for the light absorption layer 102 varies depending on the wavelength of the irradiation light, the material of the light absorption layer 102 should be selected as appropriate. In addition, the light absorption layer 102 is not limited to a single layer and may include a plurality of layers. For example, a stacked-layer structure of metal and metal nitride may be employed.

Note that the light absorption layer 102 can be formed by any of a variety of kinds of methods. For example, the light absorption layer 102 can be formed by a sputtering method, an electron beam evaporation method, a vacuum evaporation method, or the like.

The thickness of the light absorption layer 102, although it depends on a material, is set so as not to transmit the irradiation light, whereby the irradiation light can be changed to heat without being wasted. The light absorption layer 102 preferably has a thickness of greater than or equal to 10 nm and less than or equal to 2 µm. As the thickness of the light absorption layer 102 is smaller, the entire light absorption layer 102 can be heated with light having smaller energy. Accordingly, the light absorption layer 102 more preferably has a thickness of greater than or equal to 10 nm and less than or equal to 600 nm. For example, in the case of performing irradiation with light having a wavelength of 532 nm, the light absorption layer 102 with a thickness of greater than or equal to 50 nm and less than or equal to 200 nm can efficiently absorb the irradiation light to generate heat.

The light absorption layer 102 may partially transmit irradiation light as long as a material contained in the material layer 103 can be heated up to the temperature at which the material can be deposited (the temperature at which at least part of the material contained in the material layer 103 is deposited on the deposition target substrate).

The material layer 103 contains a material which is deposited on the deposition target substrate. When the deposition substrate is irradiated with light, the material contained in the material layer 103 is heated, so that at least part of the material contained in the material layer 103 is deposited on the deposition target substrate. It is considered that when the material layer 103 is heated, at least part of the material contained in the material layer 103 is evaporated, or at least part of the material layer 103 is deformed due to heat, and accordingly a film comes off due to change in stress to be deposited on the deposition target substrate.

Note that any material which can be deposited can be used as the material contained in the material layer 103 regardless of whether they are organic compounds or inorganic compounds. In the case of forming an EL layer of a light-emitting element as described in this embodiment mode, a material which can be deposited to form an EL layer is used. For example, in addition to an organic compound such as a light-emitting material, a carrier-transporting material, or a carrier-injecting material which forms an EL layer, an inorganic compound which is used for a carrier-injecting layer or an electrode or the like of a light-emitting element, such as metal oxide, metal nitride, metal halide, or an elementary substance of metal, can be used. Note that details of the materials which can be deposited to form an EL layer are given not here but in Embodiment Mode 5; therefore, Embodiment Mode 5 is referred to for the details, and the description is omitted in this embodiment mode.

The material layer 103 may contain a plurality of materials. In addition, the material layer 103 may be a single layer or a stack of a plurality of layers. Accordingly, stacking a plurality of layers each containing a material enables co-evaporation. Note that in the case where the material layer 103 has a stacked-layer structure, it is preferable that the layers in the material layer 103 be stacked so that a material which can be deposited at a low temperature is contained on the first substrate side. Such a structure makes it possible to efficiently perform evaporation using the material layer 103 which has a stacked-layer structure.

Note that as the material layer 103, a material having low absorptance of the irradiation light at the time of deposition is preferably used. Low absorptance of the irradiation light can suppress heating of the material layer except a desired region due to the irradiation light. Further, low absorptance of the irradiation light can suppress decomposition of a material contained in the material layer due to absorption of light. Further, a material contained in the material layer 103 is preferably a material which is not decomposed by the irradiation light.

Further, the material layer 103 is formed by any of various kinds of methods. For example, a wet process such as a spin coating method, a spray coating method, an ink-jet method, a dip coating method, a casting method, a die coating method, a roll coating method, a blade coating method, a bar coating method, a gravure coating method, or a printing method can be used. Alternatively, a dry method such as a vacuum evaporation method or a sputtering method can be used.

In the case of forming the material layer 103 by a wet process, a desired material may be dissolved or dispersed in a solvent, and a solution or a dispersion liquid may be adjusted. There is no particular limitation on the solvent as long as it can dissolve the material or the material can disperse in the solvent and it does not react with the material. Examples of the solvent are as follows: halogen solvents such as chloroform, tetrachloromethane, dichloromethane, 1,2-dichloroethane, and chlorobenzene; ketone solvents such as acetone, methyl ethyl ketone, diethyl ketone, n-propyl methyl ketone, and cyclohexanone; aromatic solvents such as benzene, toluene, and xylene; ester solvents such as ethyl acetate, n-propyl acetate, n-butyl acetate, ethyl propionate, γ-butyrolactone, and diethyl carbonate; ether solvents such as tetrahydrofuran and dioxane; amide solvents such as dimethylformamide and dimethylacetamide; dimethyl sulfoxide; hexane; water; and the like. A mixture of plural kinds of these solvents may also be used. By using a wet process, it is possible to increase material use efficiency, which leads to a reduction in manufacturing cost.

Note that in the case where the thickness and uniformity of a film which is formed on the deposition target substrate are controlled using the material layer 103, the thickness and uniformity of the material layer 103 should be controlled. However, the material layer 103 does not need to be a uniform layer as long as it does not affect the thickness and uniformity of a film which is formed on the deposition target substrate. For example, the material layer 103 may be formed in a minute island shape or may have unevenness.

Figure 1B:
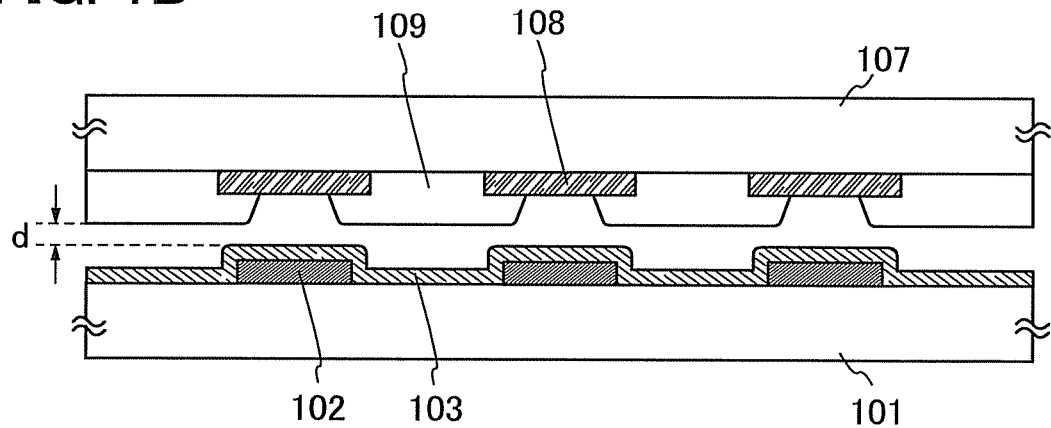

Next, as illustrated in FIG. 1B, a second substrate 107 which is a deposition target substrate is disposed at a position facing a surface which is one of surfaces of the first substrate 101 over which the light absorption layer 102 and the material layer 103 are formed. The second substrate 107 is a deposition target substrate on which a desired layer is deposited through a deposition process. Note that since a case where an EL layer of a light-emitting element is formed using the deposition substrate is described here, a first electrode 108 which serves as one of electrodes of the light-emitting element and an insulator 109 are formed on the second substrate 107. Then, the first substrate 101 and the second substrate 107 are made to face each other in proximity; specifically, they are brought close to face each other so that the distance d between the surface of the material layer 103 over the first substrate 101 and the surface of the second substrate 107 is greater than or equal to 0 mm and less than or equal to 2 mm, preferably greater than or equal to 0 mm and less than or equal to 0.05 mm, or more preferably greater than or equal to 0 mm and less than or equal to 0.03 mm.

Note that the distance d is defined as the distance between the surface of the material layer 103 over the first substrate 101 and the surface of the second substrate 107. Therefore, in the case where some layer (e.g., a conductive layer which functions as an electrode or an insulator which functions as a partition wall) is formed on the second substrate 107, the distance d is defined as the distance between the surface of the material layer 103 over the first substrate 101 and the outermost surface of the layer formed on the second substrate 107. Note that, if the surface of the material layer 103 over the first substrate 101 or the outermost surface of the layer on the second substrate 107 has unevenness, the distance d is defined as the shortest distance between the surface of the material layer 103 over the first substrate 101 and the outermost surface of the layer formed on the second substrate 107.

Figure 1C:
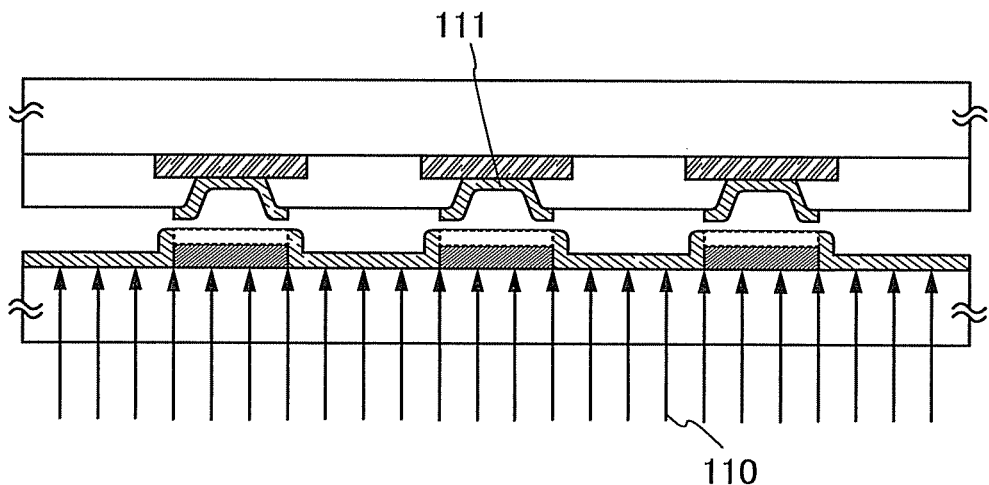

Next, as illustrated in FIG. 1C, irradiation with light 110 is performed from a rear surface (the surface on which the light absorption layer 102 and the material layer 103 are not formed) side of the first substrate 101. At this time, light delivered to the light absorption layer 102 which is formed over the first substrate 101 is absorbed, whereas light emitted to the material layer 103 is transmitted. Then, the light absorption layer 102 converts the absorbed light into heat, the heat is delivered to the material contained in a region of the material layer 103, which is in contact with the light absorption layer 102, whereby at least part of the material contained in the material layer 103 is deposited on the first electrode 108 which is formed on the second substrate 107. Thus, an EL layer 111 of a light-emitting element is formed on the second substrate 107.

As the irradiation light, laser light of which repetition rate is greater than or equal to 10 MHz and pulse width is greater than or equal to 100 fs and less than or equal to 10 ns is used. With use of such laser light of which repetition rate is very high and pulse width is very small, thermal conversion in the light absorption layer 102 is efficiently performed, and thus the material can be efficiently heated.

Further, the wavelength of the laser light is not particularly limited and laser light having a variety of wavelengths can be used. For example, laser light having a wavelength of 355 nm, 515 nm, 532 nm, 1030 nm, 1064 nm, or the like can be used.

As the laser light, it is possible to use light oscillated from one or more of a gas laser such as an Ar laser, a Kr laser, or an excimer laser; or a solid-state laser such as a laser using, as a medium, single crystalline YAG, $YVO_4$, forsterite ($Mg_2SiO_4$), $YAlO_3$, or $GdVO_4$, or polycrystalline (ceramic) YAG, $Y_2O_3$, $YVO_4$, $YAlO_3$, or $GdVO_4$, to which one or more of Nd, Yb, Cr, Ti, Ho, Er, Tm, or Ta is added as a dopant, a glass laser, a ruby laser, an alexandrite laser, a Ti:sapphire laser, or a fiber laser. Alternatively, a second harmonic, a third harmonic, or higher harmonics oscillated from the above-described solid-state laser can be used. Note that, when a solid-state laser whose laser medium is solid is used, there are advantages that a maintenance-free condition can be maintained for a long time and output is relatively stable.

The shape of a laser spot is preferably linear or rectangular. With a linear or rectangular laser spot, a substrate to be processed can be efficiently scanned with laser light. Thus, time taken for deposition (takt time) is shortened, which leads to increase in productivity.

In the present invention, the material layer 103 is heated not with radiant heat from light from a light source which is delivered but with the light absorption layer 102 which absorbs light from a light source. Accordingly, it is preferable to shorten light irradiation time so that the area of the material layer 103 is not enlarged except a desired region due to conduction of the heat in a plane direction from the light absorption layer which is irradiated with light through the substrate or the like. Further, it is preferable to reduce the light irradiation time in order to suppress decomposition of the material by irradiation of the material layer 103 with the light.

It is preferable that deposition by light irradiation be performed in a reduced-pressure atmosphere. Accordingly, it is preferable that the pressure in the deposition chamber be less than or equal to $5\times10^{-3}$ Pa, more preferably greater than or equal to $10^{-6}$ Pa and less than or equal to $10^{-4}$ Pa.

Since the laser light of which repetition rate is greater than or equal to 10 MHz and pulse width is greater than or equal to 100 fs and less than or equal to 10 ns is capable of short-time irradiation, diffusion of heat can be suppressed, and thus a minute pattern can be deposited. In addition, since the laser light of which repetition rate is greater than or equal to 10 MHz and pulse width is greater than or equal to 100 fs and less than or equal to 10 ns is capable of high output, a large area can be processed at a time, and thus time taken for deposition can be reduced. Accordingly, productivity can be improved.

Figure 2A:
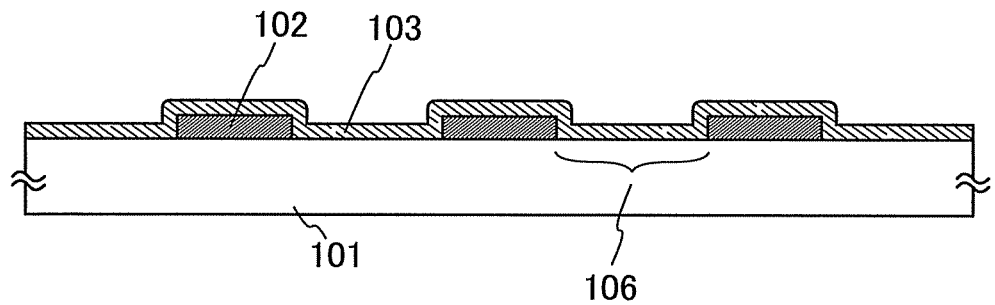
FIGS. 2A to 2C are views illustrating the deposition substrate and a deposition method of the present invention.
Figure 2B:
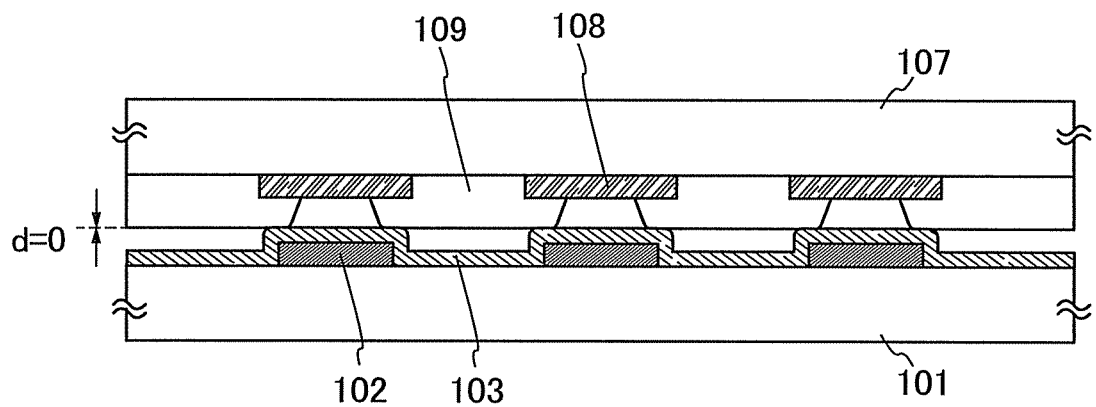
Figure 2C:
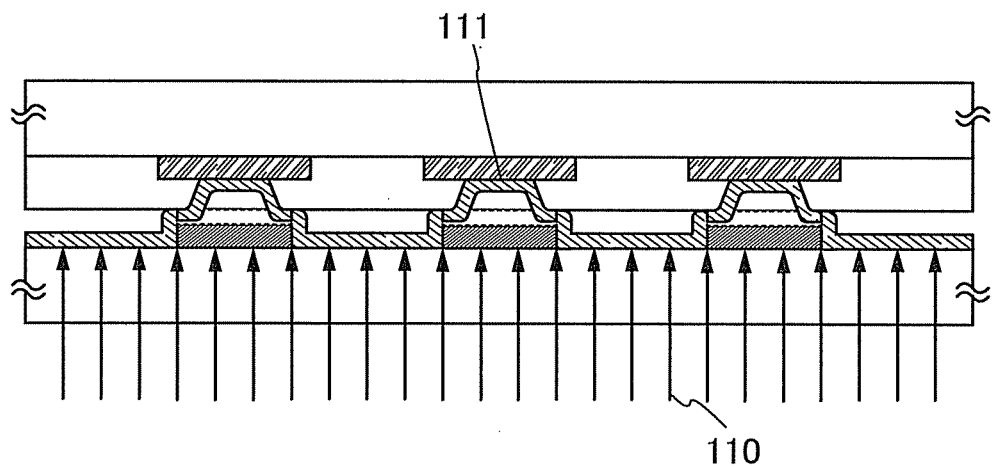

FIG. 2A illustrates a case where the distance d between the first substrate 101 and the second substrate 107 is 0 mm. That is, the case is described where the material layer 103 which is formed over the first substrate 101 and the insulator 109 which is the outermost layer of the layers formed on the second substrate 107 are in contact with each other. By reduction in the distance d as described above, at the time of the light irradiation as illustrated in FIG. 2B, the shape of a film which is deposited on the second substrate 107 can be formed with high accuracy.

Further, in this embodiment mode, the case where the first electrode 108 is formed on the second substrate 107 which is a deposition target substrate and a film is deposited on the first electrode 108 is described. The present invention can also be applied to a case where part of an EL layer is already formed on the first electrode 108. For example, a light-emitting layer can be formed using the second substrate 107 in which part of an EL layer (e.g., a hole-injecting layer or a hole-transporting layer) is formed on the first electrode 108, by application of the deposition method of the present invention. In the case of manufacturing a full-color light-emitting device, light-emitting layers should be separately formed, and use of the deposition method of the present invention makes it possible to separately form the light-emitting layers easily. In addition, the light-emitting layers can be separately formed with high accuracy.

Note that when a material with low thermal stability, such as an organic compound, has been deposited on the deposition target substrate, it is preferable that the material layer 103 formed over the first substrate 101 be not in contact with a deposition target surface of the second substrate 107 so that heat is not conducted to the film which has been deposited.

In this embodiment mode, the case where the second substrate 107 is positioned over the first substrate 101 is described; however, the present invention is not limited thereto. The orientation of the substrates can be set as appropriate. Note that when the first substrate 101 is formed by a wet process, it is not necessary to invert the first substrate 101 after formation by a wet process; therefore, it is preferable to provide the second substrate 107 over the first substrate 101.

Application of the present invention makes it possible to form a flat even film. In addition, such a film can be deposited on only a desired region, and thus a minute pattern can be formed.

Further, application of the present invention makes it possible to form a minute pattern, and thus, a high-definition light-emitting device can be manufactured.

Since only the light absorption layer and the material layer may be provided for the deposition substrate of the present invention, the deposition substrate is manufactured easily. Further, since the structure thereof is simple, manufacturing cost of the deposition substrate can be reduced.

In the deposition substrate of the present invention, the material layer and the supporting substrate are in contact with the light absorption layer; therefore, at the time of irradiation of the deposition substrate with light, diffusion of heat from the light absorption layer in the plane direction can be prevented. Accordingly, deformation which is pattern deposition except a desired pattern can be suppressed. In particular, a material having low thermal conductivity is used for the supporting substrate, whereby deformation of a deposition pattern can be further suppressed.

In the deposition method of the present invention, deposition substrates in each which the material layer is formed are prepared in advance and the deposition substrates are replaced, whereby deposition can be performed on the deposition target substrate one after another. Accordingly, application of the present invention makes it possible to reduce the time taken for manufacture or the like of the light-emitting device (takt time), which can lead to increase in productivity.

The material layer of the deposition substrate which has been used for deposition once is removed and a new material layer is formed again, whereby the deposition substrate can be used plural times. Accordingly, manufacturing cost of a light-emitting device can be reduced. A glass substrate or a quartz substrate is used as a supporting substrate of the deposition substrate of the present invention. An impurity (e.g. moisture) is not likely to be adsorbed on or attached to these substrates as compared to a film substrate or the like. Accordingly, the deposition substrate of the present invention is suitable for reuse.

In the present invention, unlike the case where the EL layer is formed by a wet process, it is not necessary to take into consideration solubility of the layer which has been formed, or the like; therefore, a material to be deposited can be chosen from a wider range. Further, the number of layers to be stacked can be set freely. Accordingly, a light-emitting device having a desired stacked-layer structure can be manufactured using a desired material. In particular, a kind of a material to be used or a stacked-layer structure can be set freely, which is important for improving performance of the light-emitting device when a substrate becomes large.

In the present invention, deposition is performed in a state where the distance between the deposition substrate and the deposition target substrate is short. Accordingly, many portions of the material layer formed over the deposition substrate are deposited on the deposition target substrate; therefore, the use efficiency of the material is high. Thus, a reduction in manufacturing cost can be achieved. Further, since deposition is performed in a state where the distance between the deposition substrate and the deposition target substrate is short, the material can be prevented from being attached to the inner wall of the deposition chamber, and maintenance of a deposition apparatus can be easier.

Further, in the present invention, laser light having a high output can be used as a light source, and thus deposition on a large area can be performed at a time. Thus, time taken for manufacturing the light-emitting device (takt time) can be reduced, which can lead to increase in productivity.

Further, by applying the present invention, the thickness of the material layer formed over the first substrate is controlled, whereby the thickness of a film to be deposited on the second substrate which is a deposition target substrate can be controlled. In other words, since the thickness of the material layer is controlled in advance, a film which is formed on the second substrate can have a desired thickness when all materials contained in the material layer formed over the first substrate is deposited; therefore, a thickness monitor is not needed at the time of deposition on the second substrate. Therefore, a user does not have to adjust the deposition rate with a thickness monitor, and the deposition process can be fully automated. Accordingly, productivity can be increased.

Further, by applying the present invention, the material contained in the material layer 103 formed over the first substrate can be deposited uniformly. Even when the material layer 103 contains plural kinds of materials, a film containing the same materials at roughly the same weight ratio as those of the material layer 103 can be deposited on the second substrate, which is the deposition target substrate. Therefore, in a deposition method of the present invention, when deposition is performed using plural kinds of materials having different vaporization temperatures, unlike co-evaporation, the evaporation rate of each material does not have to be controlled. Thus, without complicated control of the evaporation rate or the like, a desired layer containing different kinds of materials can be deposited easily with high accuracy.

Embodiment Mode 2

In this embodiment mode, a deposition method using a deposition substrate having a different structure from the deposition substrate described in Embodiment Mode 1 will be described with reference to FIGS. 3A to 3C.

Figure 3A:
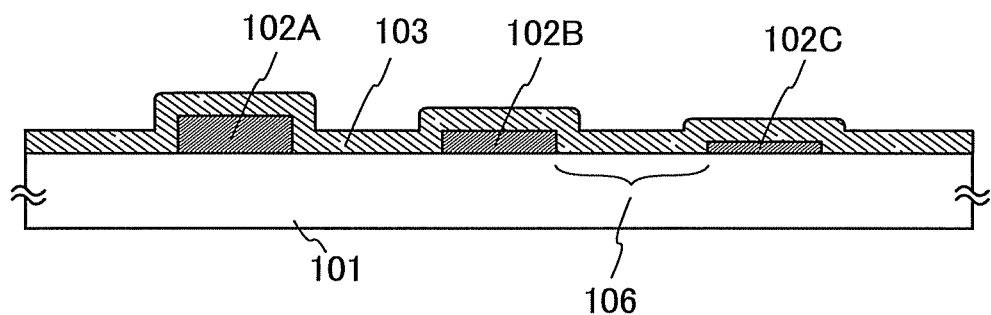
FIGS. 3A to 3C are views illustrating a deposition substrate and a deposition method of the present invention.

In a structure illustrated in FIG. 3A, light absorption layers 102A, 102B and 102C having different thicknesses are formed over the first substrate 101. The material layer 103 is formed so as to be in contact with the light absorption layers. In FIG. 3A, the material layer 103 is formed over an entire surface of the first substrate 101.

In FIG. 3A, the light absorption layer 102A has a thickness at which the irradiation light is not transmitted. At this time, the light absorption layer 102A absorbs x % of the irradiation light. The thickness of the light absorption layer 102B is smaller than that of the light absorption layer 102A and it is a thickness at which part of the irradiation light is transmitted. Accordingly, the light absorption layer 102B has a lower absorptance than the light absorption layer 102A and absorbs y % of the irradiation light (note that x>y is satisfied). The thickness of a light absorption layer 102C is smaller than that of the light absorption layer 102B and it is a thickness at which part of the irradiation light is transmitted. Accordingly, the light absorption layer 102C has a lower absorptance than the light absorption layer 102B and absorbs z % of the irradiation light (note that x>y>z is satisfied). That is, the light absorption layers 102A, 102B and 102C have different absorptance of irradiation light.

Figure 3B:
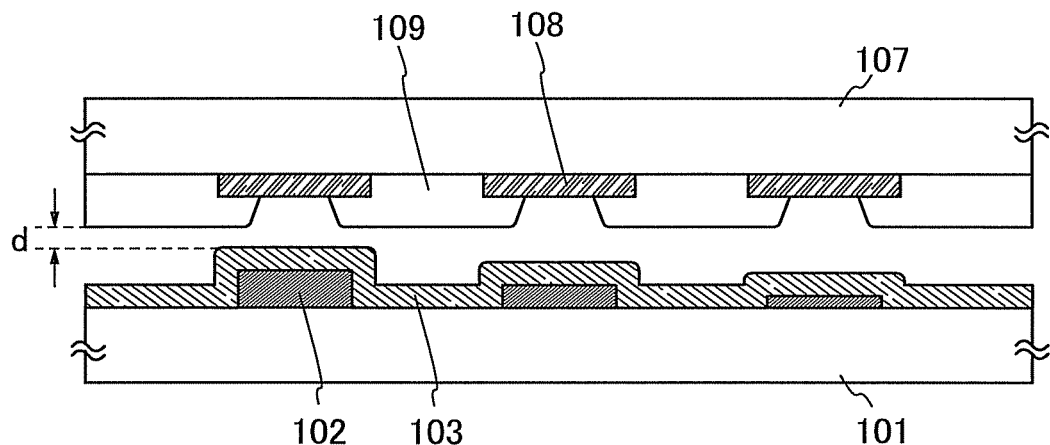
Figure 3C:
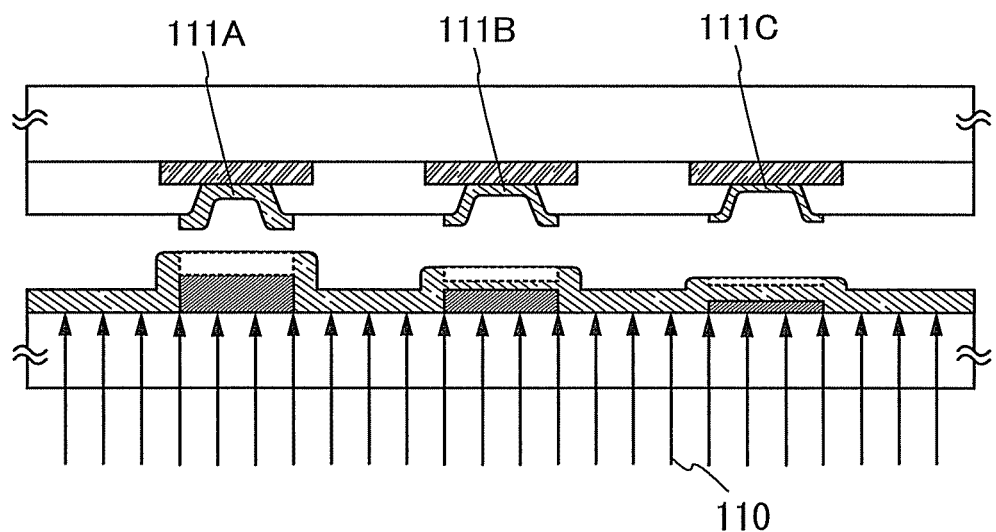

A deposition substrate having such a structure is prepared, and as illustrated in FIG. 3B, the first substrate 101 and the second substrate 107 face each other so that regions where deposition is desired to be performed correspond to the light absorption layers. Then, as illustrated in FIG. 3C, when light irradiation is performed from the first substrate 101 side, EL layers 111A, 111B, and 111C having different thicknesses are deposited depending on the thicknesses of the light absorption layers 102A, 102B and 102C.

That is, the light absorption layer 102A having a thickness at which the irradiation light is not transmitted (which absorbs x % of the irradiation light) converts all the absorbed light into heat and conducts the heat to the material layer 103. The light absorption layer 102B transmits part of the irradiation light, absorbs y % of the transmitted light (note that x>y is satisfied), and converts the absorbed light into heat. Accordingly, the amount of heat generated in the light absorption layer 102B is smaller than that generated in the light absorption layer 102A. As a result of this, the amount of heat conducted to the material layer 103 is also small, and thus, the amount of the material to be deposited is also small. Therefore, the thickness of the EL layer 111B which is deposited is smaller than that of the EL layer 111A.

The light absorption layer 102C transmits part of the irradiation light, absorbs z % of the transmitted light (note that x>y>z is satisfied), and converts the absorbed light into heat. Accordingly, the amount of heat generated in the light absorption layer 102C is smaller than that generated in the light absorption layer 102B. As a result of this, the amount of heat conducted to the material layer 103 is also smaller, and thus, the amount of the material to be deposited is also small. Therefore, the thickness of the EL layer 111C which is deposited is smaller than that of the EL layer 111B.

Accordingly, by making the light absorption layers 102A, 102B, and 102C have different thicknesses, films having different thicknesses can be deposited in one deposition step. That is, the films having different thicknesses can be deposited without increasing the number of deposition steps. Further, the thicknesses of the films to be deposited can be controlled without changing the thickness of the material layer 103. Furthermore, the thicknesses of the films to be deposited can be controlled without changing intensity of the irradiation light. Accordingly, the thicknesses of the films to be deposited can be controlled easily.

Accordingly, in manufacturing a light-emitting device, with the use of the deposition method described in this embodiment mode, layers which are used in common in light-emitting elements of each emission color can have different thicknesses without increasing the number of deposition steps. More specifically, at the time of forming a hole-injecting layer, a hole-transporting layer, an electron injecting layer, and an electron transporting layer which are used in common in light-emitting elements of each emission color, the thicknesses thereof may be different in the light emitting elements of each emission color. For example, in the case of a full-color light-emitting device, when the optical design of the light-emitting element is taken into consideration, optimal values of distances between light-emitting regions and reflective electrodes are different from each other depending on the emission wavelength. However, when layers between the light-emitting layers and the reflective electrodes are formed separately depending on each emission color in light-emitting elements of each emission color, the number of deposition steps is increased; therefore, time taken for manufacturing the light-emitting device is increased. Further, manufacturing cost of the light-emitting device is increased.

With the use of the deposition method described in this embodiment mode, layers containing the same material and having different thicknesses can be deposited in one deposition step. Therefore, the number of steps can be reduced, so that manufacturing cost of the light-emitting device can be reduced. Further, time taken for manufacturing the light-emitting device (takt time) can be reduced.

Further, with the use of the deposition method described in this embodiment mode, in the light-emitting device having a plurality of light-emitting elements, structures of light-emitting elements of each emission color can be optimized easily. For example, at the time of manufacturing a full-color light-emitting device, in order to obtain a microcavity effect, the EL layers can be formed easily so as to have different thicknesses in light-emitting elements of each emission color of R, G, and B.

Application of the present invention makes it possible to form a flat even film. In addition, such a film can be deposited on only a desired region, and thus a minute pattern can be formed.

Further, application of the present invention makes it possible to form a minute pattern, and thus, a high-definition light-emitting device can be manufactured.

The deposition substrate of the present invention may be provided with the light absorption layer and the material layer; therefore, the deposition substrate is manufactured easily. Further, since the structure thereof is simple, manufacturing cost of the deposition substrate can be reduced.

In the deposition substrate of the present invention, the material layer and the supporting substrate are in contact with the light absorption layer; therefore, at the time of irradiation of the deposition substrate with light, diffusion of heat from the light absorption layer in the plane direction can be prevented. Accordingly, deformation which is pattern deposition except a desired pattern can be suppressed. In particular, a material having low thermal conductivity is used for the supporting substrate, whereby deformation of a deposition pattern can be further suppressed.

In the deposition method of the present invention, deposition substrates in each of which the material layer is formed are prepared in advance and the deposition substrates are replaced, whereby deposition can be performed on the deposition target substrate one after another. Accordingly, application of the present invention makes it possible to reduce the time taken for manufacture or the like of the light-emitting device (takt time), which can lead to increase in productivity.

The material layer of the deposition substrate which has been used for deposition once is removed and a new material layer is formed again, whereby the deposition substrate can be used plural times. Accordingly, manufacturing cost of a light-emitting device can be reduced. A glass substrate or a quartz substrate is used as a supporting substrate of the deposition substrate of the present invention. An impurity (e.g. moisture) is not likely to be adsorbed on or attached to these substrates as compared to a film substrate or the like. Accordingly, the deposition substrate of the present invention is suitable for reuse.

In the present invention, unlike the case where the EL layer is formed by a wet process, it is not necessary to take into consideration solubility of the layer which has been formed, or the like; therefore, a material to be deposited can be chosen from a wider range. Further, the number of layers to be stacked can be set freely. Accordingly, a light-emitting device having a desired stacked-layer structure can be manufactured using a desired material. In particular, a kind of a material to be used or a stacked-layer structure can be set freely, which is important for improving performance of the light-emitting device when a substrate becomes large.

In the present invention, deposition is performed in a state where the distance between the deposition substrate and the deposition target substrate is short. Accordingly, many portions of the material layer formed over the deposition substrate are deposited on the deposition target substrate; therefore, the use efficiency of the material is high. Thus, a reduction in manufacturing cost can be achieved. Further, since deposition is performed in a state where the distance between the deposition substrate and the deposition target substrate is short, the material can be prevented from being attached to the inner wall of the deposition chamber, and maintenance of a deposition apparatus can be easier.

Further, in the present invention, laser light having a high output can be used as a light source, and thus deposition on a large area can be performed at a time. Thus, time taken for manufacturing the light-emitting device (takt time) can be reduced, which can lead to increase in productivity.

In this embodiment mode, the case where the second substrate 107 is positioned over the first substrate 101 is described; however, the present invention is not limited thereto. The orientation of the substrates can be set as appropriate. Note that when the first substrate 101 is formed by a wet process, it is not necessary to invert the first substrate 101 after formation by a wet process; therefore, it is preferable to provide the second substrate 107 over the first substrate 101.

Note that a structure described in this embodiment mode can be used in combination with any of the structures described in other embodiment modes, as appropriate.

Embodiment Mode 3

In this embodiment mode, a method of manufacturing a light-emitting device which is capable of full-color display by forming an EL layer of a light-emitting element with a plurality of deposition substrates which are described in Embodiment Modes 1 and 2 will be described.

The case in which all the EL layers are formed using the same kind of material on the plurality of electrodes formed on a second substrate, which is a deposition target substrate, through one deposition step is described in Embodiment Modes 1 and 2. In this embodiment mode, the case in which EL layers of three different color emission are formed on the plurality of electrodes formed on the second substrate will be described.

First, the deposition substrate described in Embodiment Modes 1 and 2 is prepared. For example, three deposition substrates illustrated in FIG. 1A are prepared. Note that a material layer for forming EL layers of a different emission color is formed in each deposition substrate. Specifically, a first deposition substrate having a material layer (R) containing a material for forming an EL layer exhibiting red light emission (an EL layer (R)), a second deposition substrate having a material layer (G) containing a material for forming an EL layer exhibiting green light emission (an EL layer (G)), and a third deposition substrate having a material layer (B) containing a material for forming an EL layer exhibiting blue light emission (an EL layer (B)) are prepared.

In addition, one deposition target substrate having a plurality of first electrodes in FIG. 1B in Embodiment Mode 1 is prepared. Note that since edges of the plurality of first electrodes formed on the deposition target substrate are covered with an insulator, a light emitting region corresponds to a part of the first electrode, which is exposed without being overlapped with the insulator.

First, the deposition target substrate and the first deposition substrate are superimposed on each other and aligned with each other for a first deposition process in a similar manner to FIG. 1B. Note that it is preferable that the deposition target substrate be provided with an alignment marker. The first deposition substrate is also preferably provided with the alignment marker. Note that since the first deposition substrate is provided with the light absorption layer, a portion of the light absorption layer which is near the alignment marker is preferably removed in advance. In addition, since the first deposition substrate is provided with the material layer (R), a portion of the material layer (R) which is near the alignment marker is also preferably removed in advance.

Then, light irradiation is performed from a rear surface (the surface on which the light absorption layer 102 and the material layer 103, which are illustrated in FIGS. 1A to 1C, are not formed) side of the first deposition substrate. The light absorption layer absorbs the irradiation light and provides heat to the material layer (R) to heat the material contained in the material layer (R). Thus, an EL layer (R) is formed on some of the first electrodes on the deposition target substrate. After the first deposition is completed, the first deposition substrate is moved away from the deposition target substrate.

Next, the deposition target substrate and the second deposition substrate are superimposed on each other and aligned with each other for a second deposition process. The second deposition substrate is provided with a light absorption layer in a position which is deviated by one pixel from the position of the light absorption layer of the first deposition substrate used in the first deposition.

Then, light irradiation is performed from a rear surface (the surface on which the light absorption layer 102 and the material layer 103, which are illustrated in FIGS. 1A to 1C, are not formed) side of the second deposition substrate. The light absorption layer absorbs the irradiation light and provides heat to the material layer (G) to heat the material contained in the material layer (G). Thus, an EL layer (G) is formed on some of the first electrodes on the deposition target substrate, which are next to the first electrodes on which the EL layer (R) is formed in the first deposition. After the second deposition is completed, the second deposition substrate is moved away from the deposition target substrate.

Next, the deposition target substrate and the third deposition substrate are superimposed on each other and aligned with each other for a third deposition process. The third deposition substrate is provided with a light absorption layer in a position which is shifted by two pixels from that of the first deposition substrate used in the first deposition.

Figure 4A:
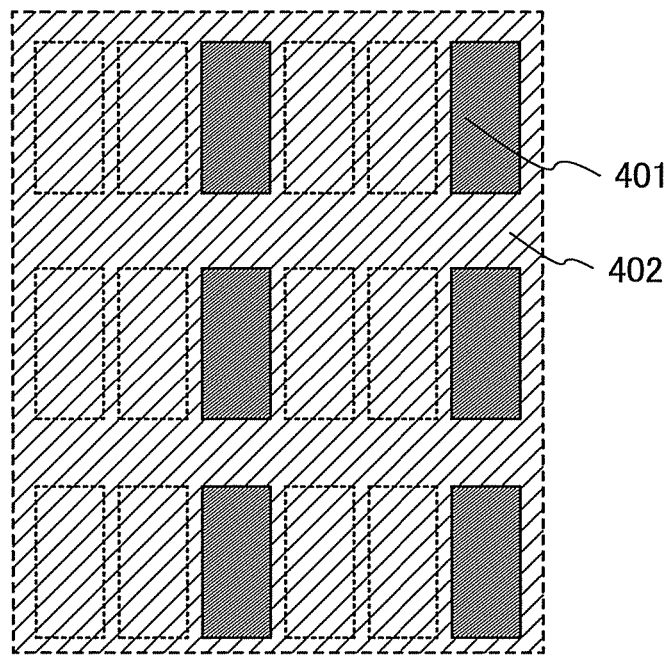
FIGS. 4A and 4B are views illustrating a deposition method of the present invention.

Then, light irradiation is performed from a rear surface (the surface on which the light absorption layer 102 and the material layer 103, which are illustrated in FIGS. 1A to 1C, are not formed) side of the third deposition substrate. A state right before the third deposition corresponds to the top view of FIG. 4A. Note that in FIG. 4A, the material layer formed over the light absorption layer is omitted. In FIG. 4A, the light absorption layer 401 is formed in an island shape and has an opening 402. A region of the deposition target substrate, which overlaps with the light absorption layer 401 of the third deposition substrate, is provided with the first electrode. Note that below regions indicated by dotted lines in FIG. 4A, the EL layer (R) 411 formed through the first deposition and the EL layer (G) 412 formed through the second deposition are positioned.

Then, an EL layer (B) 413 is formed through the third deposition. The irradiation light for the deposition substrate is not absorbed by a region where the light absorption layer is not formed (the opening 402) and is transmitted through the material layer. On the other hand, in a region where the light absorption layer 401 is formed, the light absorption layer 401 absorbs the irradiation light and provides heat to the material layer (B) to heat the material contained in the material layer (B). Thus, the EL layer (B) 413 is formed on some of the first electrodes on the deposition target substrate which are next to the first electrodes on which the EL layer (G) 412 is formed in the second deposition. After the third deposition is completed, the third deposition substrate is moved away from the deposition target substrate.

In this manner, the EL layer (R) 411, the EL layer (G) 412, and the EL layer (B) 413 can be formed at regular intervals on one deposition target substrate. Then, a second electrode is formed on these layers. Thus, light-emitting elements can be formed.

Through the above steps, light-emitting elements which exhibit light emission of different colors are formed on one substrate, whereby a light-emitting device capable of full-color display can be formed.

Figure 4B:
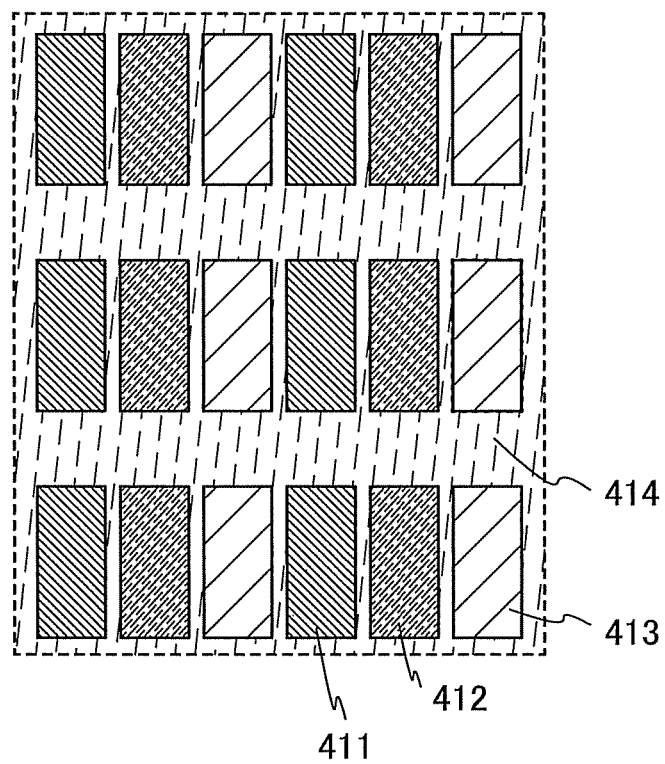

Although FIGS. 4A and 4B illustrate an example in which the light absorption layer 401 formed over the deposition substrate has a rectangular shape, there is no particular limitation and a stripe shape may be employed. In the case where a stripe shape is employed, although deposition is also performed between light-emitting regions for emitting light of the same color, the deposition between light-emitting regions is performed on the insulator 414, and thus a portion overlapping with the insulator 414 does not serve as a light-emitting region.

Figure 5A:
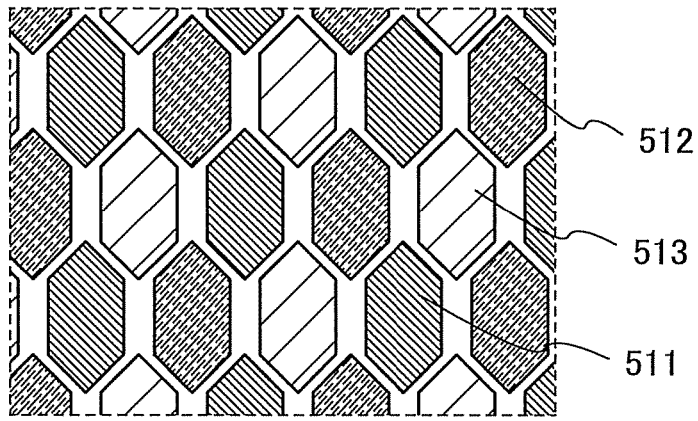
FIGS. 5A and 5B are views illustrating a deposition method of the present invention.
Figure 5B:
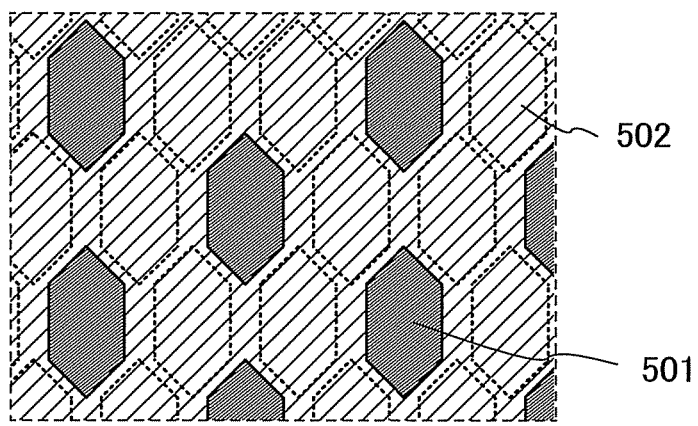

Similarly, there is no particular limitation on the arrangement of the pixels. The shape of each pixel may be a polygon, for example, a hexagon as illustrated in FIG. 5A, and a full-color light-emitting device may be realized by arrangement of the EL layer (R) 511, the EL layer (G) 512 and the EL layer (B) 513. In order to form polygonal pixels in FIG. 5A, deposition may be performed using a deposition substrate which includes a polygonal light absorption layer 501 as illustrated in FIG. 5B.

In manufacturing the light-emitting device capable of a full-color display described in this embodiment mode, application of the present invention makes it possible to form a flat even film. Further, a minute pattern can be formed and deformation which is pattern deposition except a desired pattern can be suppressed. Accordingly, a high-definition light-emitting device can be obtained.

In a manufacturing method of a light-emitting device of the present invention, deposition substrates in each of which the material layer is formed are prepared in advance and the deposition substrates are replaced, whereby deposition can be performed on the deposition target substrate one after another. Accordingly, application of the present invention makes it possible to reduce the time taken for manufacturing the light-emitting device (takt time), which can lead to increase in productivity.

The material layer of the deposition substrate which has been used for deposition once is removed and a new material layer is formed again, whereby the deposition substrate can be used plural times. Accordingly, manufacturing cost of a light-emitting device can be reduced. A glass substrate or a quartz substrate is used as a supporting substrate of the deposition substrate of the present invention. An impurity (e.g. moisture) is not likely to be adsorbed on or attached to these substrates as compared to a film substrate or the like. Accordingly, the deposition substrate of the present invention is suitable for reuse.

In the present invention, unlike the case where the EL layer is formed by a wet process, it is not necessary to take into consideration solubility of the layer which has been formed, or the like; therefore, a material to be deposited can be chosen from a wider range. Further, the number of layers to be stacked can be set freely. Accordingly, a light-emitting device having a desired stacked-layer structure can be manufactured using a desired material. In particular, a kind of a material to be used or a stacked-layer structure can be set freely, which is important for improving performance of the light-emitting device when a substrate becomes large.

Moreover, in manufacture of a light-emitting device capable of full-color display which is described in this embodiment mode, application of the present invention makes it possible to deposit a desired material on the deposition target substrate without being wasted. Thus, use efficiency of a material is increased, so that manufacturing cost can be reduced. Moreover, materials can be prevented from being attached to an inner wall of a deposition chamber, and thus maintenance of the deposition apparatus can be easier.

Further, in the present invention, laser light having a high output can be used as a light source, and thus deposition on a large area can be performed at a time. Thus, time taken for manufacturing the light-emitting device (takt time) can be reduced, which can lead to increase in productivity.

In manufacture of a light-emitting device capable of full-color display which is described in this embodiment mode, the thickness of the film which is deposited on the deposition target substrate can be controlled by controlling the thickness of a material layer which is formed over the deposition substrate. In other words, since the thickness of the material layer is controlled in advance, a film which is formed on the deposition target substrate can have a desired thickness when all materials contained in the material layer which is formed over the deposition substrate is deposited; therefore, a thickness monitor is not needed at the time of deposition on the deposition target substrate. Therefore, a user does not have to adjust the deposition rate with a thickness monitor, and the deposition process can be fully automated. Accordingly, productivity can be increased.

In addition, in manufacture of a light-emitting device capable of full-color display which is described in this embodiment mode, application of the present invention makes it possible to uniformly deposit a material contained in the material layer which is formed over the deposition substrate. In the case where the material layer contains plural kinds of materials, a film containing the same materials at roughly the same weight ratio as the material layer can be deposited on the deposition target substrate. Therefore, in a deposition method of the present invention, when deposition is performed using plural kinds of materials having different vaporization temperatures, a desired layer containing different kinds of materials can be deposited easily with high precision without complicated control of the evaporation rate or the like.

Further, in manufacture of a light-emitting device capable of full-color display which is described in this embodiment mode, in the case of using the deposition substrate described in Embodiment Mode 2, layers which contain the same materials and have different thicknesses can be deposited in one deposition step. Accordingly, with the use of the deposition substrate described in Embodiment Mode 2, layers which are used in common in light-emitting elements of each emission color can have different thicknesses without increasing the number of deposition steps. More specifically, in forming a hole-injecting layer, a hole-transporting layer, an electron injecting layer, and an electron transporting layer which are used in common in light-emitting elements of each emission color, the thicknesses thereof may be different in the light-emitting elements of each emission color and can be optimized. Therefore, performance (e.g. efficiency or color reproducibility) of the light-emitting device can be improved. For example, at the time of manufacturing a full-color light-emitting device, in order to obtain a microcavity effect, the EL layers can be formed easily so as to have different thicknesses in light-emitting elements of each emission color of R, G and B.

Note that a structure described in this embodiment mode can be used in combination with any of the structures described in other embodiment modes, as appropriate.

Embodiment Mode 4

In this embodiment mode, an example of a deposition apparatus which performs deposition by irradiating a deposition substrate with laser light and a method of laser irradiation will be described.

Figure 6:
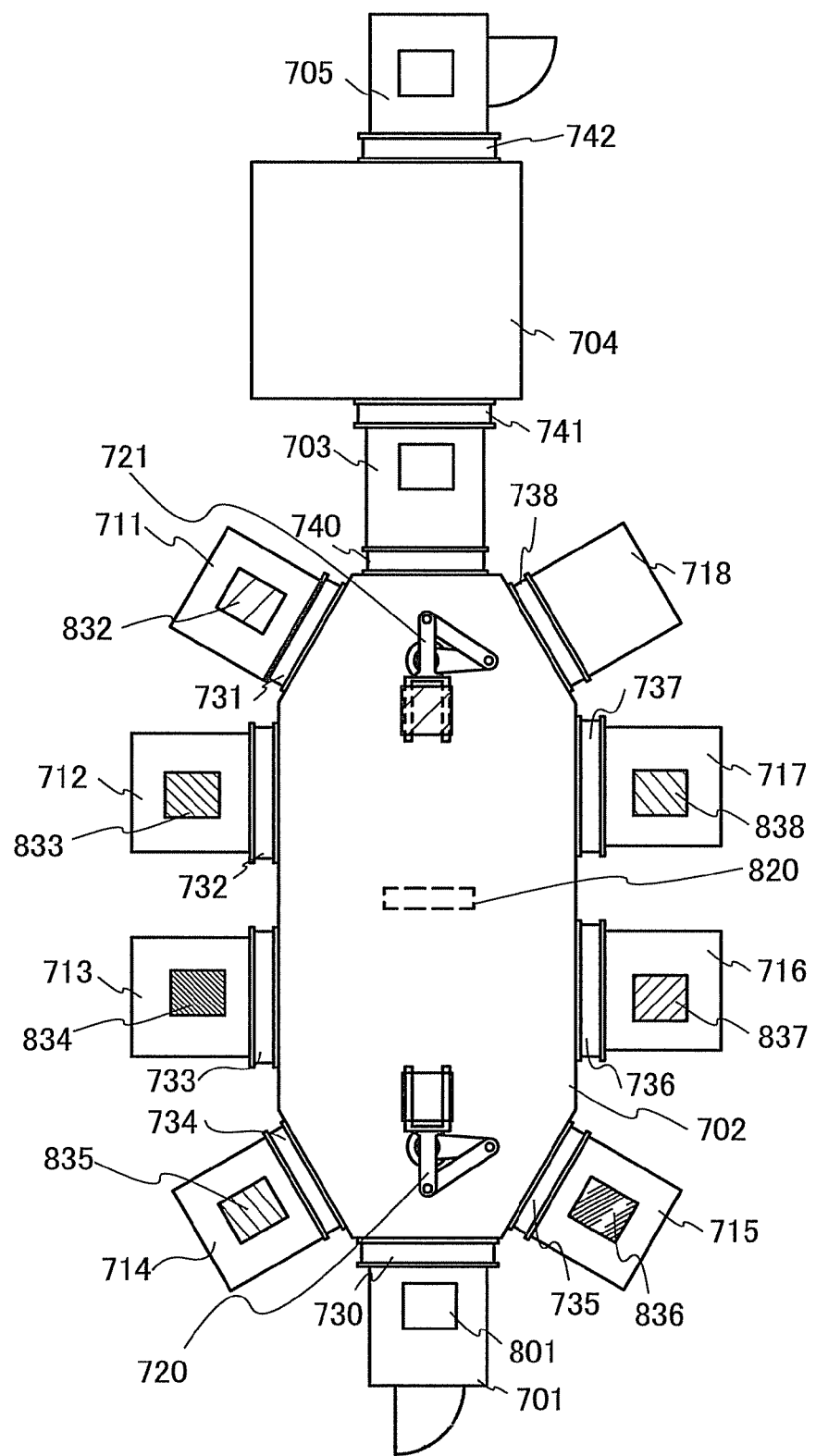
FIG. 6 is a view illustrating a deposition apparatus.

FIG. 6 is a top view illustrating a schematic example of a deposition apparatus. The deposition apparatus illustrated in FIG. 6 includes a load chamber 701, a common chamber 702 connected to the load chamber, and a plurality of treatment chambers 711, 712, 713, 714, 715, 716, 717, and 718 connected to the common chamber. The treatment chambers 711, 712, 713, 714, 715, 716, 717, and 718 are connected to the common chamber 702 through gate valves 731, 732, 733, 734, 735, 736, 737, and 738, respectively.

In the deposition apparatus illustrated in FIG. 6, deposition is performed on a deposition target substrate in the common chamber 702. Therefore, it is preferable that a vacuum evacuation means be provided so that moisture or the like is not mixed and the common chamber 702 be evacuated by vacuum evacuation. Further, as a material for the inner wall of the common chamber 702, aluminum, stainless steel (SUS), or the like which has been electropolished to have a mirror surface is used because the degree of adsorption of impurities such as oxygen or moisture can be reduced by reducing the surface area of the inner wall. Thus, the degree of vacuum of the common chamber 702 can be maintained in the range of $10^{-4}$ Pa to $10^{-6}$ Pa. Further, a material such as ceramics which has been processed so that there are very few air holes is used as an inner member. Note that such a material has preferably surface smoothness where the center line average roughness is less than or equal to 3 nm.

Further, for maintenance of the common chamber 702, the common chamber 702 is coupled to an inert gas introduction system for introducing an inert gas (such as nitrogen) so that the inside of the common chamber is made in the atmospheric pressure state.

Furthermore, the bottom of the common chamber 702 is provided with a window 820 for introducing laser light emitted from a laser light source into the inside of the common chamber.

Figure 7:
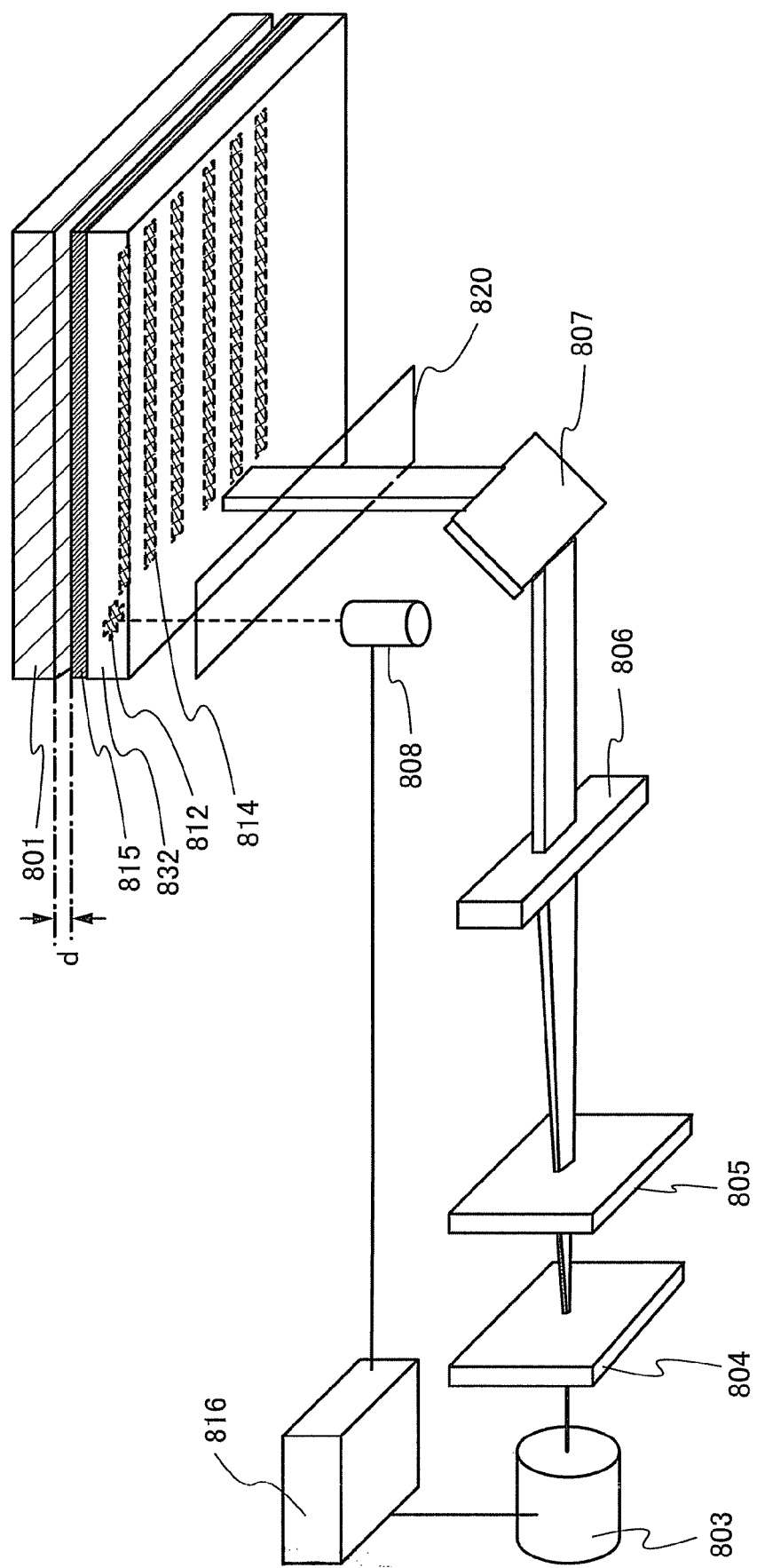
FIG. 7 is a view illustrating a deposition method of the present invention.

Here, FIG. 7 is a schematic view illustrating the positional relationship between the window 820 and a laser device 803 at the time of deposition.

First, a deposition target substrate, which is a second substrate 801, is transferred from the load chamber 701 to the common chamber 702 through the gate valve 730 and is disposed so that a deposition target surface of the second substrate 801 faces downward. In order to reduce attachment of dust to the load chamber, a plurality of second substrates 801 are set in a substrate cassette or the like in the load chamber so that the deposition target surfaces thereof face downward. Since it is preferable to perform vacuum baking on the second substrate 801 in advance, the load chamber is provided with a vacuum baking device. It is preferable to provide a vacuum baking chamber for removing moisture or the like attached to the second substrate between the load chamber 701 and the common chamber 702.

Further, a first substrate 832 having a light absorption layer 814 provided selectively in advance and a first material layer 815 is disposed so as to face the second substrate 801 with a distance d maintained. A heat resistant metal is preferably used for the light absorption layer 814. For example, and a single layer or a stacked layer of titanium, tungsten, tantalum, molybdenum, or the like can be used. Here, titanium nitride which is a metal nitride is used. In FIG. 7, an example where the shape of the light absorption layer 814 is linear is illustrated; however, there is no particular limitation, and the light absorption layer 814 may have a dot shape or the same shape as the first electrode provided on the second substrate. Note that a surface of the first substrate 832 over which the first material layer is provided faces upward and faces a deposition target surface of the second substrate 801. The second substrate 801 and the first substrate 832 are aligned by an alignment means and are held at a predetermined distance d, preferably less than or equal to 5 mm.

A plurality of first electrodes is provided on the second substrate 801 in advance. In the case where an insulator which serves as a partition wall is also provided, the insulator and the first material layer 815 may be disposed so as to be in contact with each other.

The pair of substrates is moved with the predetermined distance d maintained, and scanning with laser light is performed. Here, the pair of substrates are moved by a substrate moving means in the long-side direction or the short-side direction of the rectangular window. Here, an example is described where scanning with the laser light is performed by moving the substrates; however, there is no particular limitation and the substrates may be fixed and scanning may be performed by moving the laser light with the substrates fixed.

A positional alignment marker 812 formed using the same material as the light absorption layer 814 is provided for the first substrate 832 and a reference position of scanning is recognized by an imaging element 808 for recognizing the positional alignment marker 812. It is preferable that the apparatus have a structure where the view of the imaging element 808 such as a CCD is not blocked. Note that since the positional alignment marker 812 is recognized from the bottom side of the first substrate, the first substrate 832 may be irradiated with auxiliary illumination light. An example where the imaging element 808 recognizes the positional alignment marker 812 through the window 820 is described; however, there is no particular limitation, and a window may be provided separately, and alternatively, the imaging element may be provided inside the chamber.

Laser light is outputted from the laser device 803 and transmitted through a first optical system 804 for changing a laser light shape into a rectangular shape, a second optical system 805 for shaping the laser light, and a third optical system 806 for collimating a beam; and an optical path is bent to a direction perpendicular to the first substrate 832 by using a reflecting mirror 807. After that, a laser beam is transmitted through the window 820 which transmits light and the first substrate 832, so that the light absorption layer 814 is irradiated with the laser beam. The window 820 can be made to have the same size as or the smaller size than the width of the laser beam to serve as a slit.

The laser device 803 emits laser light of which repetition rate is greater than or equal to 10 MHz and pulse width is greater than or equal to 100 fs and less than or equal to 10 ns. There is no particular limitation on a wavelength of laser light, and laser light having a variety of wavelengths can be used. For example, laser light having a wavelength of 355 nm, 515 nm, 532 nm, 1030 nm, 1064 nm, or the like can be used. As the laser light, it is possible to use light oscillated from one or more of a gas laser such as an Ar laser, a Kr laser, or an excimer laser; or a solid-state laser such as a laser using, as a medium, single crystalline YAG, YVO$_4$, forsterite (Mg$_2$SiO$_4$), YAlO$_3$, or GdVO$_4$, or polycrystalline (ceramic) YAG, Y$_2$O$_3$, YVO$_4$, YAlO$_3$, or GdVO$_4$, to which one or more of Nd, Yb, Cr, Ti, Ho, Er, Tm, or Ta is added as a dopant, a glass laser, a ruby laser, an alexandrite laser, a Ti:sapphire laser, or a fiber laser. Alternatively, a second harmonic, a third harmonic, or higher harmonics oscillated from the above-described solid-state laser can be used. Note that, when a solid-state laser whose laser medium is solid is used, there are advantages that a maintenance-free condition can be maintained for a long time and output is relatively stable.

The shape of a laser spot is preferably linear or rectangular. With a linear or rectangular laser spot, a substrate to be processed can be efficiently scanned with laser light. Thus, time taken for deposition (takt time) is shortened, which leads to increase in productivity.

A control device 816 is preferably interlocked so that it can also control the substrate moving means which moves the pair of substrates. Furthermore, the control device 816 is preferably interlocked so that it can also control the laser device 803. Moreover, the control device 816 is preferably interlocked with a positional alignment mechanism which has the imaging element 808 for recognizing the positional alignment marker 812.

After scanning with the laser light, over the first substrate 832, the first material layer 815 which overlaps with the light absorption layer 814 disappears, and deposition is selectively performed on the second substrate 801 disposed so as to face the first substrate 832. Note that over the first substrate 832, the first material layer 815 which does not overlap with the light absorption layer 814 remains. When the first substrate 832 on which scanning with the laser light has been performed is collected and the remaining first material layer is removed, the first substrate 832 can be reused.

Next, the procedure of staking layers will be described with reference to FIG. 6. For example, in the case where a layer provided on the first electrode on the second substrate by heating the first material layer provided over the first substrate 832 is a hole-injecting layer, after scanning with the laser light is performed through the above-described procedure to form a hole-injecting layer selectively on the second substrate 801, a third substrate 833 over which a second material layer is formed in advance and the second substrate 801 are aligned and held with a predetermined distance. This positional alignment is performed with the use of the same apparatus as that for aligning the first substrate and the second substrate. Since the same positional alignment apparatus is used, positional misalignment can be suppressed.

The treatment chamber 711 connected to the common chamber 702 is a deposition treatment chamber where the first material layer is deposited over the first substrate. The treatment chamber 712 connected to the common chamber 702 is a deposition treatment chamber where the second material layer is deposited over the third substrate 833. A light absorption layer is also provided between the second material layer and the surface of the third substrate 833. A layer provided in a position overlapping with the hole-injecting layer of the second substrate by heating the second material layer provided over the third substrate 833 is a hole-transporting layer.

Note that a transfer unit 720 and a transfer unit 721 such as a transfer robot arm are provided in the common chamber 702. With the use of the transfer units, the second substrate, the first substrate, or the like is transferred between the common chamber and each treatment chamber.

After the third substrate 833 and the second substrate 801 are aligned, scanning with laser light is performed and the hole-transporting layer is stacked in the position overlapping with the hole-injecting layer on the second substrate. Note that over the third substrate 833, the second material layer which does not overlap with the light absorption layer remains. When the third substrate on which scanning with the laser light has been performed is collected and the remaining second material layer is removed, the third substrate can be reused.

The layers can be stacked through the above-described procedure. In the case where the time between the end of deposition of the hole-injecting layer and the start of deposition of the hole-transporting layer is desired to be shortened, a place where the first substrate on which scanning with the laser light has been performed is temporarily disposed, for example, a substrate cassette, is provided in the common chamber, whereby time for which the hole-injecting layer is exposed can be shortened. The first substrate and the third substrate are transferred to the common chamber almost at the same time, first scanning with the laser light is performed, the first substrate on which scanning with the laser light has been performed is moved to the substrate cassette, the third substrate transferred in advance is aligned with the second substrate, and second scanning with the laser light can be performed. In this case, since the gate valve of the common chamber is not opened and closed during deposition of the two layers, the degree of vacuum of the common chamber can be maintained and contamination due to impurities can be prevented.

Further, in order to manufacture a full-color light-emitting device, a red light-emitting layer, a green light-emitting layer, and a blue light-emitting layer are selectively deposited so as to be spaced apart from each other. This procedure will be described with reference to FIGS. 8A to 8C.

Through the above-described steps, scanning with the laser light is performed twice using the first substrate 832 and the third substrate 833, whereby a hole-injecting layer 823 and a hole-transporting layer 824 are stacked on the first electrode 821 provided on the second substrate 801. Note that a partition wall 822 which covers end portions of the first electrode 821 and ensures insulation between the adjacent first electrodes is provided on the second substrate 801.

Figure 8A:
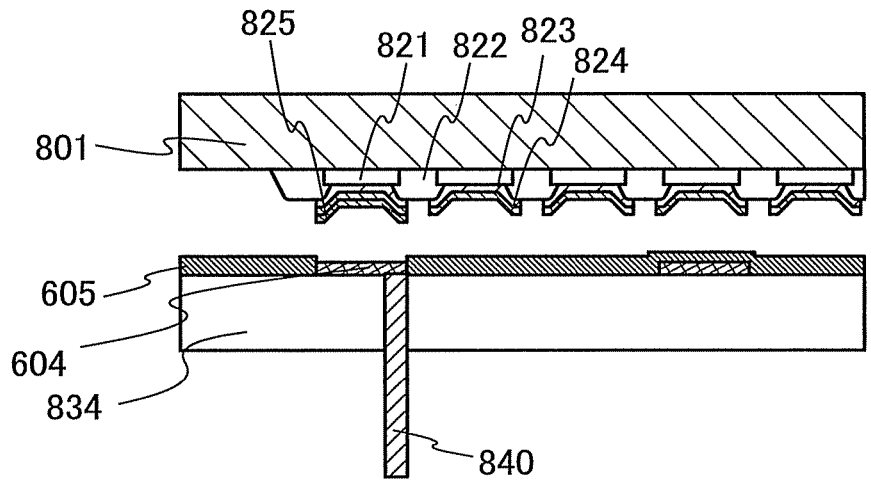
FIGS. 8A to 8C are views illustrating a deposition method of the present invention.

FIG. 8A is a cross-sectional schematic view illustrating a state where the second substrate 801 and a fourth substrate 834 are aligned and disposed so as to face each other and third scanning with laser light is being performed with a predetermined distance between the substrates maintained.

A light absorption layer 604 which is selectively formed and a third material layer 605 are formed over the fourth substrate 834 in advance. The third material layer 605 is deposited over the fourth substrate 834 in the treatment chamber 713 and the fourth substrate 834 is transferred to the common chamber.

As illustrated in FIG. 8A, the third material layer 605 is partially heated by irradiation with laser light 840, so that a red light-emitting layer 825 is selectively deposited in a position overlapping with the hole-transporting layer 824.

Figure 8B:
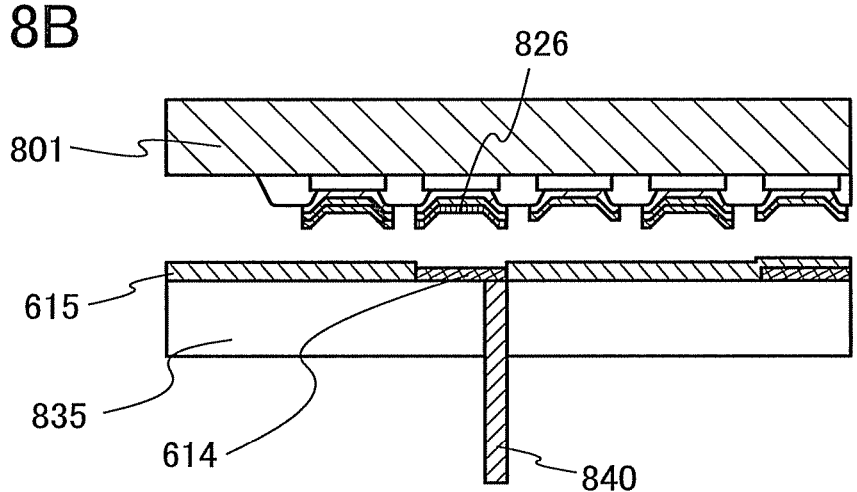

Next, the fourth substrate 834 on which scanning with laser light has been performed is moved, and the second substrate 801 and a fifth substrate 835 are aligned and disposed so as to face each other. FIG. 8B is a cross-sectional schematic view illustrating a state where fourth scanning with laser light is being performed with a predetermined distance between the substrates maintained.

A light absorption layer 614 which is selectively formed and a fourth material layer 615 are formed over the fifth substrate 835 in advance. The fourth material layer 615 is deposited over the fifth substrate 835 in the treatment chamber 714 and the fifth substrate 835 is transferred to the common chamber.

As illustrated in FIG. 8B, the fourth material layer 615 is partially heated by irradiation with laser light 840, so that a green light-emitting layer 826 is selectively deposited in a position overlapping with the hole-transporting layer 824.

Figure 8C:
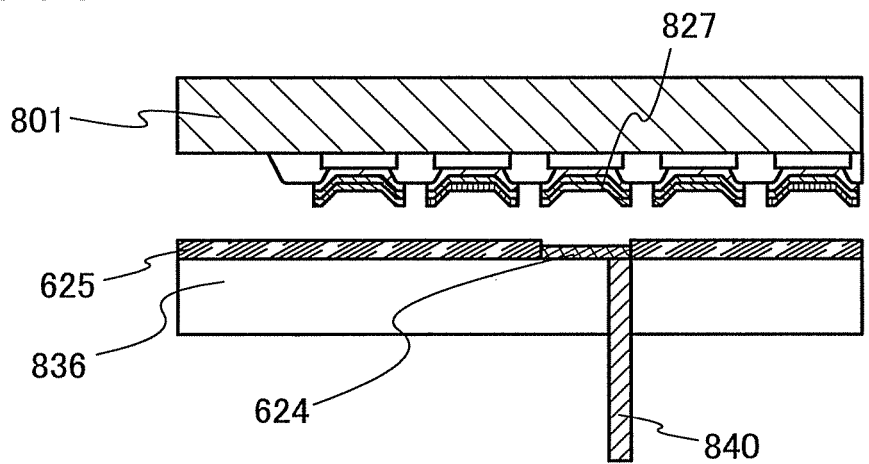

Next, the fifth substrate 835 on which scanning with the laser light has been performed is moved, and the second substrate 801 and a sixth substrate 836 are aligned and disposed so as to face each other. FIG. 8C is a cross-sectional schematic view illustrating a state where fifth scanning with laser light is being performed with a predetermined distance between the substrates maintained.

A light absorption layer 624 which is selectively formed and a fifth material layer 625 are formed over the sixth substrate 836 in advance. The fifth material layer 625 is deposited over the sixth substrate 836 in the treatment chamber 715 and the sixth substrate 836 is transferred to the common chamber.

As illustrated in FIG. 8C, the fifth material layer 625 is partially heated by irradiation with laser light 840, so that a blue light-emitting layer 827 is selectively deposited in a position overlapping with the hole-transporting layer 824.

Through the above-described procedure, the red light-emitting layer, the green light-emitting layer, and the blue light-emitting layer can be selectively deposited so as to be spaced apart from each other.

In the case where the time between the end of deposition of the light-emitting layer and the start of deposition of the light-emitting layer to be deposited subsequently is desired to be shortened, a place where the fourth substrate, the fifth substrate, and the sixth substrate on which scanning with the laser light has been performed are temporarily disposed, for example, a substrate cassette, is provided in the common chamber, whereby time for which each light-emitting layer is exposed can be shortened. The fourth substrate, the fifth substrate, and the sixth substrate are transferred to the common chamber almost at the same time, the third scanning with the laser light is performed, the fourth substrate on which scanning with the laser light has been performed is moved to the substrate cassette, the fifth substrate transferred in advance is aligned with the second substrate, and the fourth scanning with the laser light can be performed. Further, the fifth substrate on which scanning with the laser light has been performed is moved to the substrate cassette, the sixth substrate transferred in advance is aligned with the second substrate, and the fifth scanning with the laser light can be performed. In this case, since the gate valve of the common chamber is not opened and closed during deposition of the three layers, the degree of vacuum of the common chamber can be maintained and contamination due to impurities can be prevented.

After that, sixth scanning with laser light is performed using a seventh substrate 837 over which a sixth material layer is formed, so that an electron-transporting layer which overlaps with each light-emitting layer is selectively formed. The sixth material layer is deposited over the seventh substrate 837 in the treatment chamber 716 and the seventh substrate 837 is transferred to the common chamber.

Further, seventh scanning with laser light is performed using an eighth substrate 838 over which a seventh material layer is formed, so that an electron-injecting layer which overlaps with the electron-transporting layer is selectively formed. The seventh material layer is deposited over the eighth substrate in the treatment chamber 717 and the eighth substrate 838 is transferred to the common chamber.

In the case where the time between the end of deposition of the electron-transporting layer and the start of deposition of the electron-injecting layer to be deposited subsequently is desired to be shortened, a place where the seventh substrate 837 and the eighth substrate 838 on which scanning with the laser light has been performed are temporarily disposed, for example, a substrate cassette, is provided in the common chamber, whereby time for which each light-emitting layer is exposed can be shortened.

In a deposition method of heating a material layer deposited over a substrate different from a deposition target substrate in advance with the use of laser light, since a necessary amount of a material for deposition is limited and an amount of the vaporized material is smaller than that in a conventional resistance heating method, a plurality of transfer robots, alignment means, substrate moving means, or the like can be provided in the common chamber where deposition is performed. Moreover, in the deposition method of heating a material layer deposited over a substrate different from a deposition target substrate in advance with the use of laser light, even when different light-emitting layers are deposited in the same treatment chamber, different light-emitting materials can be prevented from being mixed.

Further, a place where the first substrate and the third to eighth substrates are temporarily disposed, for example, a substrate cassette, is provided, whereby the first substrate and the third to eighth substrates can be transferred to the common chamber almost at the same time in transferring the second substrate to the common chamber. When the same number of substrates as that of layers to be deposited is prepared, deposition can be performed in a shorter time.

Next, a second electrode is formed on the second substrate on which the layers are stacked as described above, whereby a light-emitting element having at least the first electrode, the second electrode, and a light-emitting layer therebetween is manufactured. Note that the second electrode is deposited by a sputtering method, an electron beam method, or the like. The second electrode is preferably formed in the common chamber. In the case of using a sputtering method, a plasma generation means and a means which introduces a sputtering target and a material gas are further provided in the common chamber. Further, it is preferable to provide a shutter mechanism which prevents deposition on the window 820 at the time of forming the second electrode.

Alternatively, a structure may be employed in which a sputtering target is stocked in the treatment chamber 718 and is moved to the common chamber before forming the second electrode, and deposition can be performed by sputtering in the common chamber. In that case, a means which moves the target to the common chamber is provided.

After forming the second electrode, the substrate is transferred to a delivery chamber 703 through a gate valve 740 using the transfer unit 721, and further, the substrate is transferred to a sealing chamber 704 through a gate valve 741. The substrate on which sealing has been performed in the sealing chamber 704 is transferred to an unload chamber 705 through a gate valve 742 and can be taken out of the deposition apparatus. Through the above-described procedure, a light-emitting element (also referred to as an EL element) can be manufactured.

Here, an example is described in which an EL layer provided between the first electrode and the second electrode includes five layers, that is, a stacked layer of a hole-injecting layer, a hole-transporting layer, a light-emitting layer, an electron-transporting layer and an electron-injecting layer; however, there is no particular limitation and a stacked layer of a hole-transporting layer, a light-emitting layer and an electron-transporting layer may be employed, and the structure of the EL layer may be set as appropriate in consideration of a light-emitting material, emission efficiency, or the like by a practitioner.

Further, the treatment chamber 718 may also serve as a stock chamber which stocks a substrate after laser irradiation. It is preferable that the treatment chamber 718 serve as a stock chamber which stocks a substrate after laser irradiation and the substrate after laser irradiation be carried out from the common chamber 702 and moved to the treatment chamber 718 at the same time as transferring the second substrate on which the second electrode is formed to the delivery chamber 703. Thus, deposition can be performed smoothly on the second substrate which is transferred subsequently to the common chamber.

Alternatively, the treatment chamber 718 may also serve as a stock chamber which stocks the first substrate and the third to eighth substrates before laser irradiation.

In the above-described procedure, an example is described in which the second electrode is formed in the common chamber; however, the treatment chamber 718 may serve as a deposition treatment chamber in which the second electrode is formed.

Note that the common chamber is provided with only two transfer units in FIG. 6; however, there is no particular limitation and more transfer units may be provided in order to transfer the first substrate and the third to eighth substrates efficiently. Further, a transfer unit may be provided in the treatment chambers 711, 712, 713, 714, 715, 716, 717, and 718.

FIG. 6 illustrates a deposition apparatus in which the substrates are inserted from the load chamber 701 and taken out from the unload chamber 705; however, there is no particular limitation and a load chamber may be provided in each of the treatment chambers 711, 712, 713, 714, 715, 716, and 717 through a gate valve. The substrates over each of which the light absorption layer is provided (the first substrate and the third to eighth substrates) each may be inserted from a load chamber provided in each of the treatment chambers.

Further, in the case of depositing a material layer in each of the treatment chambers 711, 712, 713, 714, 715, 716, and 717 by a coating method such as a spin coating method, it is preferable to provide a baking chamber which performs baking between the common chamber and the treatment chamber. In a spin coating method, deposition of a material layer is performed by a face-up system, and the substrate can be transferred to the common chamber without being reversed and aligned with the second substrate, which is efficient.

In the case of depositing a material layer by a face-down system such as an evaporation method in each of the treatment chambers 711, 712, 713, 714, 715, 716, and 717, the transfer unit may be provided with a reversal mechanism. Alternatively, the treatment chamber 718 may be provided with a substrate reversal unit and serve as a reversing chamber.

By using such a deposition apparatus, the light-emitting device can be manufactured. With the use of the deposition apparatus described in this embodiment mode, deposition substrates in each of which the material layer is formed are prepared in advance and the deposition substrates are replaced, whereby deposition can be performed on the deposition target substrate one after another. Accordingly, the time taken for deposition (takt time) can be shortened, which can lead to increase in productivity.

Further, application of the present invention makes it possible to form a flat even film. Furthermore, a minute pattern can be formed and deformation which is pattern deposition except a desired pattern can be suppressed. Accordingly, a high-definition light-emitting device can be obtained.

In the present invention, unlike the case where the EL layer is formed by a wet process, it is not necessary to take into consideration solubility of the layer which has been formed, or the like; therefore, a material to be deposited can be chosen from a wider range. Further, the number of layers to be stacked can be set freely. Accordingly, a light-emitting device having a desired stacked-layer structure can be manufactured using a desired material. In particular, a kind of a material to be used or a stacked-layer structure can be set freely, which is important for improving performance of the light-emitting device when a substrate becomes large.

Moreover, in manufacture of a light-emitting device capable of full-color display which is described in this embodiment mode, application of the present invention makes it possible to deposit a desired material on the deposition target substrate without being wasted. Thus, use efficiency of a material is increased, so that manufacturing cost can be reduced. Moreover, materials can be prevented from being attached to an inner wall of a deposition chamber, and thus maintenance of the deposition apparatus can be easier.

Further, in the present invention, laser light having a high output can be used as a light source, and thus deposition on a large area can be performed at a time. Thus, time taken for manufacturing the light-emitting device (takt time) can be reduced, which can lead to increase in productivity.

Further, in the present invention, since a thickness of a film to be deposited on the deposition target substrate can be controlled by controlling the thickness of the material layer formed over the deposition substrate, a thickness monitor is not needed at the time of deposition on the deposition target substrate. Therefore, a user does not have to adjust the deposition rate with a thickness monitor, and the deposition process can be fully automated. Accordingly, productivity can be increased.

In addition, application of the present invention makes it possible to uniformly deposit the material contained in the material layer which is formed over the deposition substrate. In the case where the material layer contains plural kinds of materials, a film containing the same materials at roughly the same weight ratio as the material layer can be deposited on the deposition target substrate. Therefore, in a deposition method of the present invention, when deposition is performed using plural kinds of materials having different vaporization temperatures, a desired layer containing different kinds of materials can be deposited easily with high precision without complicated control of the evaporation rate or the like.

Further, in the case of manufacturing a light-emitting device using the deposition substrate described in Embodiment Mode 2, layers which contain the same material and have different thicknesses can be deposited in one deposition step. Accordingly, an optical design can be optimized in such a manner that layers which are used in common in light-emitting elements of each emission color are deposited so as to have different thicknesses without increasing the number of deposition steps. Therefore, performance of the light-emitting device (efficiency, color purity, or the like) can be improved.

Note that a structure described in this embodiment mode can be used in combination with any of structures described in other embodiment modes, as appropriate.

Embodiment Mode 5

In this embodiment mode, a manufacturing method of a light-emitting element and a light-emitting device by application of the present invention will be described.

Figure 9A:
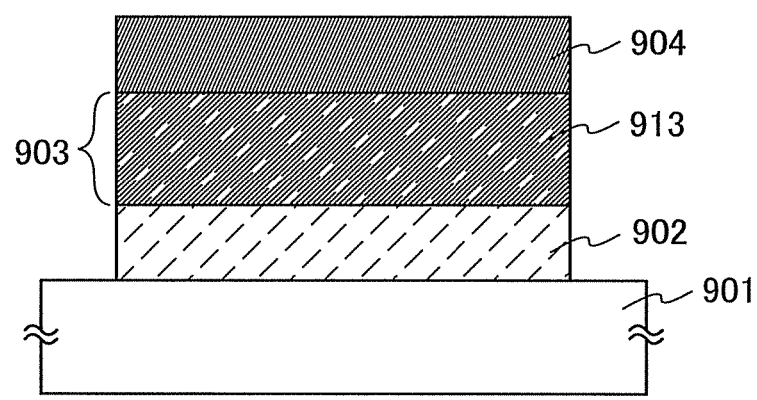
FIGS. 9A and 9B are views each illustrating a light-emitting element.
Figure 9B:
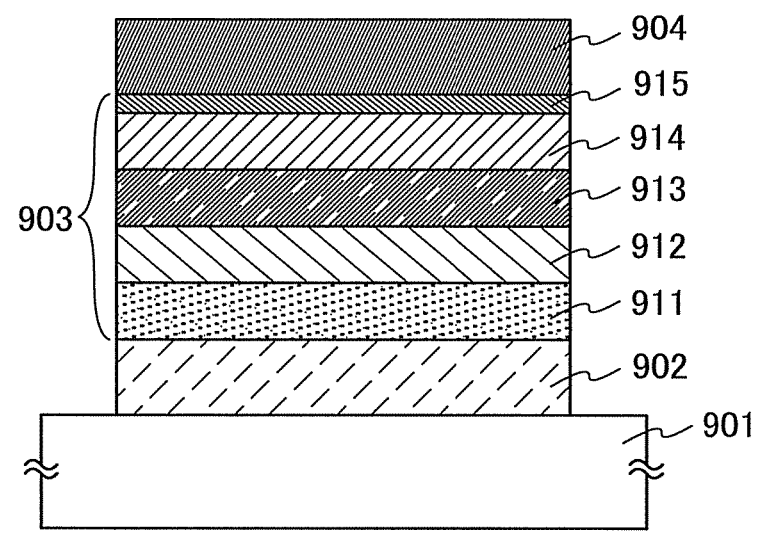

For example, light-emitting elements illustrated in FIGS. 9A and 9B can be manufactured by application of the present invention. In the light-emitting element illustrated in FIG. 9A, a first electrode 902, an EL layer 903 which includes only a light-emitting layer 913 and a second electrode 904 are stacked in that order over a substrate 901. One of the first electrode 902 and the second electrode 904 functions as an anode, and the other functions as a cathode. Holes injected from an anode and electrons injected from a cathode are recombined in the EL layer 903, whereby light emission can be obtained. In this embodiment mode, the first electrode 902 functions as the anode and the second electrode 904 functions as the cathode.

In the light-emitting element illustrated in FIG. 9B, the EL layer 903 in FIG. 9A has a stacked structure including a plurality of layers. Specifically, a hole-injecting layer 911, a hole-transporting layer 912, the light-emitting layer 913, an electron-transporting layer 914, and an electron-injecting layer 915 are provided in that order from the first electrode 902 side. Note that the EL layer 903 functions by including at least the light-emitting layer 913 as in FIG. 9A; therefore, all of the above layers are not always necessary and may be selected as appropriate to be provided as needed.

As the substrate 901 in FIGS. 9A and 9B, a substrate having an insulating surface or an insulating substrate is employed. Specifically, any of a variety of glass substrates used for the electronics industry such as an aluminosilicate glass substrate, an aluminoborosilicate glass substrate, or a barium borosilicate glass substrate; a quartz substrate; a ceramic substrate; a sapphire substrate; or the like can be used.

For the first electrode 902 and the second electrode 904, any of various types of metals, alloys, electrically conductive compounds, mixtures thereof, and the like can be used. Specific examples are given below: indium tin oxide (ITO), indium tin oxide containing silicon or silicon oxide, indium zinc oxide (IZO), and indium oxide containing tungsten oxide and zinc oxide. In addition, gold (Au), platinum (Pt), nickel (Ni), tungsten (W), chromium (Cr), molybdenum (Mo), iron (Fe), cobalt (Co), copper (Cu), palladium (Pd), nitride of a metal material (such as titanium nitride), and the like can be given.

A film of any of those materials is generally formed by sputtering. For example, a film of indium zinc oxide can be formed by a sputtering method using a target in which zinc oxide is added to indium oxide at 1 to 20 wt %. A film of indium oxide containing tungsten oxide and zinc oxide can be formed by a sputtering method using a target in which tungsten oxide and zinc oxide are added to indium oxide at 0.5 to 5 wt % and 0.1 to 1 wt %, respectively. Further, a film of any of those materials may be formed by an ink-jet method, a spin coating method, or the like by application of a sol-gel process or the like.

Furthermore, aluminum (Al), silver (Ag), an alloy containing aluminum, or the like can be used. Moreover, any of the following materials having a low work function can be used: elements which belong to Group 1 and Group 2 of the periodic table, that is, alkali metals such as lithium (Li) and cesium (Cs) and alkaline-earth metals such as magnesium (Mg), calcium (Ca), and strontium (Sr), and alloys thereof (an alloy of aluminum, magnesium, and silver, and an alloy of aluminum and lithium); rare earth metals such as europium (Eu) and ytterbium (Yb), and alloys thereof; and the like.

A film of an alkali metal, an alkaline earth metal, and an alloy thereof can be formed by a vacuum evaporation method. A film of an alloy containing an alkali metal or an alkaline earth metal can be formed by a sputtering method. Further, a film of a silver paste or the like can be formed by an ink-jet method or the like for the electrodes. The first electrode 902 and the second electrode 904 are not limited to a single-layer film and can be formed as a stacked-layer film.

Note that in order to extract light emitted from the EL layer 903 to the outside, one or both of the first electrode 902 and the second electrode 904 are formed so as to transmit light. For example, one or both of the first electrode 902 and the second electrode 904 are formed using a conductive material having a light-transmitting property, such as indium tin oxide, or formed using silver, aluminum, or the like with a thickness of several nanometers to several tens of nanometers. Alternatively, one or both of the first electrode 902 and the second electrode 904 can have a stacked-layer structure including a thin film of a metal such as silver, aluminum, or the like with a reduced thickness and a thin film of a conductive material having a light-transmitting property, such as ITO.

The EL layer 903 (the hole-injecting layer 911, the hole-transporting layer 912, the light-emitting layer 913, the electron-transporting layer 914, or the electron-injecting layer 915) of the light-emitting element in this embodiment mode can be formed by application of the deposition method described in Embodiment Modes 1 and 2. In addition, the electrode can also be formed by application of the deposition method described in Embodiment Modes 1 and 2.

For example, in the case where the light-emitting element illustrated in FIG. 9A is formed, a material layer of the deposition substrate described in Embodiment Mode 1 is formed using a material which forms the EL layer 903, and the EL layer 903 is formed over the first electrode 902 over the substrate 901 using the deposition substrate. Then, the second electrode 904 is formed over the EL layer 903, whereby the light-emitting element in FIG. 9A can be obtained.

Any of a variety of materials can be used for the light-emitting layer 913. For example, a fluorescent compound which exhibits fluorescence or a phosphorescent compound which exhibits phosphorescence can be used.

Examples of a phosphorescent compound which is used for the light-emitting layer 913 are given below. As a material for blue light emission, bis[2-(4',6'-difluorophenyl)pyridinato-N,$C^{2'}$]iridium(III)tetrakis(1-pyrazolyl)borate (abbr.: FIr6), bis[2-(4',6'-difluorophenyl)pyridinato-N,$C^{2'}$]iridium(III)picolinate (abbr.: FIrpic), bis[2-(3',5'bistrifluoromethylphenyl)pyridinato-N,$C^{2'}$]iridium(III)picolinate (abbr.: Ir(CF$_3$ppy)$_2$(Pic)), bis [2-(4',6'-difluorophenyl)pyridinato-N,$C^{2'}$]iridium(III)acetylacetonate (abbr.: FIr(acac)) or the like can be given. As a material for green light emission, tris(2-phenylpyridinato-N,$C^{2'}$)iridium(III) (abbr.: Ir(ppy)$_3$), bis[2-phenylpyridinato-N,$C^{2'}$]iridium(III)acetylacetonate (abbr.: Ir(ppy)$_2$(acac)), bis(1,2-diphenyl-1H-benzimidazolato)iridium(III)acetylacetonate (abbr.: Ir(pbi)$_2$(acac)), bis(benzo[h]quinolinato)iridium(III)acetylacetonate (abbr.: Ir(bzq)$_2$(acac)) or the like can be given. As a material for yellow light emission, bis(2,4-diphenyl-1,3-oxazolato-N,$C^{2'}$)iridium(III)acetylacetonate (abbr.: Ir(dpo)$_2$(acac)), bis[2-(4'-perfluorophenylphenyl)pyridinato]iridium(III)acetylacetonate (abbr.: Ir(p-PF-ph)$_2$(acac)), bis(2-phenylbenzothiazolato-N,$C^{2'}$)iridium(III)acetylacetonate (abbr.: Ir(bt)$_2$(acac)) or the like can be given. As a material for orange light emission, tris(2-phenylquinolinato-N,$C^{2'}$)iridium(III) (abbr.: Ir(pq)$_3$), bis(2-phenylquinolinato-N,$C^{2'}$)iridium(III)acetylacetonate (abbr.: Ir(pq)$_2$(acac)) or the like can be given. As a material for red light emission, organometallic complex such as bis[2-(2'-benzo[4,5-α]thienyl)pyridinato-N,$C^{3'}$]iridium(III)acetylacetonate (abbr.: Ir(btp)$_2$(acac)), bis(1-phenylisoquinolinato-N,$C^{2'}$)iridium(III)acetylacetonate (abbr.: Ir(piq)$_2$(acac)), (acetylacetonato)bis[2,3-bis(4-fluorophenyl)quinoxalinato]iridium(III) (abbr.: Ir(Fdpq)$_2$(acac)), or (2,3,7,8,12,13,17,18-octaethyl-21H,23H-porphyrinato)platinum(II) (abbr.: PtOEP) can be given. In addition, a rare earth metal complex such as tris(acetylacetonato)(monophenanthroline)terbium (III) (abbr.: Tb(acac)$_3$(Phen)), tris(1,3-diphenyl-1,3-propanedionato)(monophenanthroline)europium(III) (abbr.: Eu(DBM)$_3$(Phen)), or tris[1-(2-thenoyl)-3,3,3-trifluoroacetonato](monophenanthroline)europium(III) (abbr.: Eu(TTA)$_3$(Phen)) performs light emission (electron transition between different multiplicities) from a rare earth metal ion; therefore, such a rare earth metal complex can be used as a phosphorescent compound.

Examples of a fluorescent compound which is used for the light-emitting layer 913 are given below. As a material for blue light emission, N,N'-bis[4-(9H-carbazol-9-yl)phenyl]-N,N'-diphenylstilbene-4,4'-diamine (abbr.: YGA2S), 4-(9H-carbazol-9-yl)-4'-(10-phenyl-9-anthryl)triphenylamine (abbr.: YGAPA), or the like can be given. As a material for green light emission, N-(9,10-diphenyl-2-anthryl)-N,9-diphenyl-9H-carbazol-3-amine (abbr.: 2PCAPA), N-[9,10-bis(1,1'-biphenyl-2-yl)-2-anthryl]-N,9-diphenyl-9H-carbazol-3-amine (abbr.: 2PCABPhA), N-(9,10-diphenyl-2-anthryl)-N,N',N'-triphenyl-1,4-phenylenediamine (abbr.: 2DPAPA), N-[9,10-bis(1,1'-biphenyl-2-yl)-2-anthryl]-N,N',N'-triphenyl-1,4-phenylenediamine (abbr.: 2DPABPhA), N-[9,10-bis(1,1'-biphenyl-2-yl)]-N[4-(9H-carbazol-9-yl)phenyl]-N-phenylanthracen-2-a mine (abbr.: 2YGABPhA), N,N,9-triphenylanthracen-9-amine (abbr.: DPhAPhA), or the like can be given. As a material for yellow light emission, rubrene, 5,12-bis(1,1'-biphenyl-4-yl)-6,11-diphenyltetracene (abbr.: BPT), or the like can be given. As a material for red light emission, N,N,N',N'-tetrakis(4-methylphenyl)tetracene-5,11-diamine (abbr.: p-mPhTD), 7,13-diphenyl-N,N,N',N'-tetrakis(4-methylphenyl)acenaphtho[1,2-α]fluoranthene-3,10-diamine (abbr.: p-mPhAFD), or the like can be given.

The light-emitting layer 913 may have a structure in which a substance having a high light-emitting property (dopant material) is dispersed in another substance (host material), whereby crystallization of the light-emitting layer can be suppressed. In addition, concentration quenching which results from high concentration of the substance having a high light-emitting property can be suppressed.

As the substance in which the substance having a high light-emitting property is dispersed, when the substance having a high light-emitting property is a fluorescent compound, a substance having higher singlet excitation energy (the energy difference between a ground state and a singlet excited state) than the fluorescent compound is preferably used. When the substance having a high light-emitting property is a phosphorescent compound, a substance having higher triplet excitation energy (the energy difference between a ground state and a triplet excited state) than the phosphorescent compound is preferably used.

Examples of host materials used for the light-emitting layer 913 are given below: 4,4'-bis[N-(1-naphthyl)-N-phenylamino]biphenyl (abbr.: NPB), tris(8-quinolinolato)aluminum(III) (abbr.: Alq), 4,4'-bis[N-(9,9-dimethylfluoren-2-yl)-N-phenylamino]biphenyl (abbr.: DFLDPBi), bis(2-methyl-8-quinolinolato)(4-phenylphenolato)aluminum(III) (abbr.: BAlq), 4,4'-di(9-carbazolyl)biphenyl (abbr.: CBP), 2-tert-butyl-9,10-di(2-naphthyl)anthracene (abbr.: t-BuDNA), and 9-[4-(9-carbazolyl)phenyl]-10-phenylanthracene (abbr.: CzPA).

As the dopant material, any of the above-mentioned phosphorescent compounds and fluorescent compounds can be used.

When the light-emitting layer 913 has a structure in which a substance having a high light-emitting property (dopant material) is dispersed in another substance (host material), a mixed layer of a host material and a guest material is formed as the material layer over the deposition substrate. Alternatively, the material layer over the deposition substrate may have a structure in which a layer containing a host material and a layer containing a dopant material are stacked. By forming the light-emitting layer 913 using a deposition substrate with the material layer having such a structure, the light-emitting layer 913 contains a substance in which a light-emitting material is dispersed (host material) and a substance having a high light-emitting property (dopant material), and has a structure in which the substance having a high light-emitting property (dopant material) is dispersed in the substance in which a light-emitting material is dispersed (host material). Note that for the light-emitting layer 913, two or more kinds of host materials and a dopant material may be used, or two or more kinds of dopant materials and a host material may be used. Alternatively, two or more kinds of host materials and two or more kinds of dopant materials may be used.

In the case where the light-emitting element illustrated in FIG. 9B is formed, the deposition substrate described in Embodiment Modes 1 and 2, which has a material layer formed using a material for forming each layer in the EL layer 903 (the hole-injecting layer 911, the hole-transporting layer 912, the light-emitting layer 913, the electron-transporting layer 914, and the electron-injecting layer 915) is prepared, and deposition of each layer is performed using a different deposition substrate by the method described in Embodiment Modes 1 and 2, whereby the EL layer 903 can be formed over the first electrode 902 over the substrate 901. Then, the second electrode 904 is formed over the EL layer 903; thus, the light-emitting element illustrated in FIG. 9B can be formed. Note that although all the layers in the EL layer 903 can be formed by the method described in Embodiment Modes 1 and 2 in this case, only some of the layers in the EL layer 903 may be formed by the method described in Embodiment Modes 1 and 2.

For example, the hole-injecting layer 911 can be formed using molybdenum oxide, vanadium oxide, ruthenium oxide, tungsten oxide, manganese oxide, or the like. Alternatively, the hole-injecting layer can be formed using a phthalocyanine-based compound such as phthalocyanine (abbr.: $H_2Pc$) or copper phthalocyanine (abbr.: CuPc), a high molecular compound such as poly(3,4-ethylenedioxythiophene)/poly(styrenesulfonic acid) (PEDOT/PSS), or the like.

As the hole-injecting layer 911, a layer which contains a substance having a high hole-transporting property and a substance having an electron-accepting property can be used. The layer which contains a substance having a high hole-transporting property and a substance having an electron-accepting property has high carrier density and an excellent hole-injecting property. When the layer which contains a substance having a high hole-transporting property and a substance having an electron-accepting property is used as a hole-injecting layer which is in contact with an electrode that functions as an anode, any of a variety of metals, alloys, electrically conductive compounds, mixtures thereof, and the like can be used for the electrode regardless of the magnitude of work function of a material of the electrode which functions as an anode.

The layer which contains a substance having a high hole-transporting property and a substance having an electron-accepting property can be formed using, for example, a deposition substrate having a material layer which is a stack of a layer containing a substance having a high hole-transporting property and a layer containing a substance having an electron-accepting property.

Examples of the substance having an electron-accepting property which is used for the hole-injecting layer 911 are given below: 7,7,8,8-tetracyano-2,3,5,6-tetrafluoroquinodimethane (abbr.: $F_4$-TCNQ), chloranil, and the like. Other examples are transition metal oxides. Still other examples are oxide of metal belonging to Group 4 to Group 8 of the periodic table. Specifically, vanadium oxide, niobium oxide, tantalum oxide, chromium oxide, molybdenum oxide, tungsten oxide, manganese oxide, and rhenium oxide are preferable because of their high electron-accepting properties. Among them, molybdenum oxide is especially preferable because it is stable also in the atmosphere, has a low hygroscopic property, and can be easily handled.

As the substance having a high hole-transporting property used for the hole-injecting layer 911, any of various compounds such as an aromatic amine compound, a carbazole derivative, an aromatic hydrocarbon, and a high molecular compound (such as an oligomer, a dendrimer, and a polymer) can be used. Note that it is preferable that the substance having a high hole-transporting property used for the hole-injecting layer be a substance having a hole mobility of $10^{-6}$ $cm^2/Vs$ or higher. Note that any other substance that has a hole-transporting property higher than an electron-transporting property may be used. Specific examples of the substance having a high hole-transporting property, which can be used for the hole-injecting layer 911, are given below.

Examples of an aromatic amine compound which can be used for the hole-injecting layer 911 are given below; 4,4'-bis[N-(1-naphthyl)-N-phenylamino]biphenyl (abbr.: NPB), N,N'-bis(3-methylphenyl)-N,N'-diphenyl-[1,1'-biphenyl]-4,4'-diamine (abbr.: TPD), 4,4',4''-tris(N,N-diphenylamino)triphenylamine (abbr.: TDATA), 4,4',4''-tris[N-(3-methylphenyl)-N-phenylamino]triphenylamine (abbr.: MTDATA), 4,4'-bis[N-(spiro-9,9'-bifluoren-2-yl)-N-phenylamino]biphenyl (abbr.: BSPB), and the like. Other examples are as follows: N,N-bis(4-methylphenyl)(p-tolyl)-N,N'-diphenyl-p-phenylenediamine (abbr.: DTDPPA), 4,4'-bis[N-(4-diphenylaminophenyl)-N-phenylamino]biphenyl (abbr.: DPAB), 4,4'-bis(N-{4-[N'-(3-methylphenyl)-N'-phenylamino]phenyl}-N-phenylamino)biphenyl (abbr.: DNTPD), and 1,3,5-tris[N-(4-diphenylaminophenyl)-N-phenylamino]benzene (abbr.: DPA3B).

Specific examples of a carbazole derivative which can be used for the hole-injecting layer 911 are given below: 3-[N-(9-phenylcarbazol-3-yl)-N-phenylamino]-9-phenylcarbazole (abbr.: PCzPCA1), 3,6-bis[N-(9-phenylcarbazol-3-yl)-N-phenylamino]-9-phenylcarbazole (abbr.: PCzPCA2), and 3-[N-(1-naphthyl)-N-(9-phenylcarbazol-3-yl)amino]-9-phenylcarbazole (abbr.: PCzPCN1).

Other examples of a carbazole derivative which can be used for the hole-injecting layer 911 are given below: 4,4'-di(N-carbazolyl)biphenyl (abbr.: CBP), 1,3,5-tris[4-(N-carbazolyl)phenyl]benzene (abbr.: TCPB), 9-[4-(10-phenyl-9-anthryl)phenyl]-9H-carbazole (abbr.: CzPA), and 1,4-bis-[4-(N-carbazolyl)phenyl]-2,3,5,6-tetraphenylbenzene.

Examples of an aromatic hydrocarbon which can be used for the hole-injecting layer 911 are given below: 2-tert-butyl-9,10-di(2-naphthyl)anthracene (abbr.: t-BuDNA), 2-tert-butyl-9,10-di(1-naphthyl)anthracene, 9,10-bis(3,5-diphenylphenyl)anthracene (abbr.: DPPA), 2-tert-butyl-9,10-bis(4-phenylphenyl)anthracene (abbr.: t-BuDBA), 9,10-di(2-naphthyl)anthracene (abbr.: DNA), 9,10-diphenylanthracene (abbr.: DPAnth), 2-tert-butylanthracene (abbr.: t-BuAnth), 9,10-bis(4-methyl-1-naphthyl)anthracene (abbr.: DMNA), 9,10-bis[2-(1-naphthyl)phenyl]-2-tert-butyl-anthracene, 9,10-bis [2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, and the like. Besides, pentacene, coronene, or the like can also be used. As these aromatic hydrocarbons listed here, it is preferable that an aromatic hydrocarbon having a hole mobility of greater than or equal to $1 \times 10^{-6}$ $cm^2/Vs$ and having 14 to 42 carbon atoms be used.

Note that an aromatic hydrocarbon which can be used for the hole-injecting layer 911 may have a vinyl skeleton. Examples of an aromatic hydrocarbon having a vinyl group are given below: 4,4'-bis(2,2-diphenylvinyl)biphenyl (abbr.: DPVBi), and 9,10-bis[4-(2,2-diphenylvinyl)phenyl]anthracene (abbr.: DPVPA).

The hole-injecting layer 911 can be formed by using a deposition substrate having a material layer which is a stack of a layer containing a substance having a high hole-transporting property and a layer containing a substance having an electron-accepting property. When metal oxide is used as the substance having an electron-accepting property, it is preferable that a layer which contains the metal oxide be formed after the layer which contains a substance having a high hole-transporting property be formed over a supporting substrate which is a deposition substrate. This is because, in many cases, metal oxide has a higher temperature at which evaporation can be performed than a substance having a high hole-transporting property. The deposition substrate with such a structure makes it possible to efficiently deposit a substance having a high hole-transporting property and metal oxide. In addition, local non-uniformity of the concentration in a film deposited can be suppressed. Further, there are few kinds of solvents which allow both a substance having a high hole-transporting property and metal oxide to be dissolved or dispersed therein, and a mixed solution is not easily formed; therefore, it is difficult to directly form a mixed layer by a wet process. However, the use of the deposition method of the present invention makes it possible to easily form a mixed layer which contains a substance having a high hole-transporting property and metal oxide.

In addition, the layer which contains a substance having a high hole-transporting property and a substance having an electron-accepting property is excellent in not only a hole-injecting property but also a hole-transporting property, and thus the above-described hole-injecting layer 911 may be used as the hole-transporting layer.

The hole-transporting layer 912 is a layer which contains a substance having a high hole-transporting property. Examples of the substance having a high hole-transporting property are given below: an aromatic amine compound such as 4,4'-bis[N-(1-naphthyl)-N-phenylamino]biphenyl (abbr.: NPB or α-NPD), N,N'-bis(3-methylphenyl)-N,N'-diphenyl-[1,1'-biphenyl]-4,4'-diamine (abbr.: TPD), 4,4',4''-tris(N,N-diphenylamino)triphenylamine (abbr.: TDATA), 4,4',4''-tris[N-(3-methylphenyl)-N-phenylamino]triphenylamine (abbr.: MTDATA), and 4,4'-bis[N-(spiro-9,9'-bifluoren-2-yl)-N-phenylamino]biphenyl (abbr.: BSPB). Most of the substances mentioned here have a hole mobility of greater than or equal to $10^{-6}$ cm$^2$/Vs. Note that any other material which has a hole-transporting property higher than an electron-transporting property may be used. Note that the layer which contains a substance having a high hole-transporting property is not limited to a single layer and may be a stacked layer of two or more layers formed using the above-mentioned substances.

The electron-transporting layer 914 is a layer which contains a substance having a high electron-transporting property. Examples thereof are given below: metal complexes having a quinoline skeleton or a benzoquinoline skeleton, such as tris(8-quinolinolato)aluminum (abbr.: Alq), tris(4-methyl-8-quinolinolato)aluminum (abbr.: Almq$_3$), bis(10-hydroxybenzo[h]quinolinato)beryllium (abbr.: BeBq$_2$), and bis(2-methyl-8-quinolinolato)(4-phenylphenolato)aluminum (abbr.: BAlq). Other examples are metal complexes having an oxazole-based ligand or a thiazole-based ligand, such as bis[2-(2-hydroxyphenyl)benzoxazolato]zinc (abbr.: Zn(BOX)$_2$), and bis[2-(2-hydroxyphenyl)benzothiazolato]zinc (abbr.: Zn(BTZ)$_2$). Besides metal complexes, other examples are given below: 2-(4-biphenylyl)-5-(4-tert-butylphenyl)-1,3,4-oxadiazole (abbr.: PBD), 1,3-bis[5-(p-tert-butylphenyl)-1,3,4-oxadiazol-2-yl]benzene (abbr.: OXD-7), 3-(4-biphenylyl)-4-phenyl-5-(4-tert-butylbiphenyl)-1,2,4-triazole (abbr.: TAZ01), bathophenanthroline (abbr.: BPhen), and bathocuproine (abbr.: BCP). Most of the substances mentioned here have an electron mobility of $10^{-6}$ cm$^2$/Vs or higher. Note that any other material that has an electron-transporting property higher than a hole-transporting property may be used for the electron-transporting layer. The electron-transporting layer is not limited to a single layer and may be a stacked layer of two or more layers formed using the above-mentioned substances.

The electron-injecting layer 915 can be formed using an alkali metal compound or an alkaline earth metal compound, such as lithium fluoride (LiF), cesium fluoride (CsF), or calcium fluoride (CaF$_2$). Further, a layer in which a substance having an electron-transporting property is combined with an alkali metal or an alkaline earth metal can be employed. For example, a layer of Alq containing magnesium (Mg) can be used. Note that it is preferable that the layer in which a substance having an electron-transporting property is combined with an alkali metal or an alkaline earth metal be used as the electron-injecting layer because electrons are efficiently injected from the second electrode 904.

Note that there is no particular limitation on a stacked-layer structure of layers of the EL layer 903. The EL layer 903 may be formed by an appropriate combination of a light-emitting layer with a layer formed using a substance having a high electron-transporting property, a substance having a high hole-transporting property, a substance having a high electron-injecting property, a substance having a high hole-injecting property, a bipolar substance (a substance having high electron-transporting and hole-transporting properties), or the like.

Light emission from the EL layer 903 is extracted to the outside through one or both of the first electrode 902 and the second electrode 904. Therefore, one or both of the first electrode 902 and the second electrode 904 are an electrode having a light-transmitting property. In the case where only the first electrode 902 is an electrode having a light-transmitting property, light is extracted from the substrate 901 side through the first electrode 902. In the case where only the second electrode 904 is an electrode having a light-transmitting property, light is extracted from the side opposite to the substrate 901 side through the second electrode 904. In the case where both the first electrode 902 and the second electrode 904 are electrodes having a light-transmitting property, light is extracted from both the substrate 901 side and the side opposite to the substrate 901 side through the first electrode 902 and the second electrode 904.

Note that, although FIGS. 9A and 9B illustrate the structure in which the first electrode 902 functioning as an anode is provided on the substrate 901 side, the second electrode 904 functioning as a cathode may be provided on the substrate 901 side.

The EL layer 903 may be formed by the deposition method described in Embodiment Modes 1 and 2 or may be formed by a combination of the deposition method described in Embodiment Modes 1 and 2 with another deposition method. Further, each electrode and each layer may be formed by a different deposition method. Examples of a dry method include a vacuum evaporation method, an electron beam evaporation method, a sputtering method. Examples of a wet process include a spin coating method, a spray coating method, an ink-jet method, a dip coating method, a casting method, a die coating method, a roll coating method, a blade coating method, a bar coating method, a gravure coating method, a printing method, and the like.

In the light-emitting element of this embodiment mode, an EL layer to which the present invention is applied can be formed. Accordingly, by application of the present invention, formation of an EL layer forming a light-emitting element as well as manufacture of a light-emitting device including the light-emitting element can be facilitated.

Further, by application of the present invention, a flat even film can be deposited; therefore, a light-emitting device with excellent performance can be manufactured with high productivity.

Furthermore, by application of the present invention, a minute pattern can be formed and deformation which is pattern deposition except a desired pattern can be suppressed; therefore, a high-definition light-emitting device can be manufactured.

In the present invention, unlike the case where the EL layer is formed by a wet process, it is not necessary to take into consideration solubility of the layer which has been formed, or the like; therefore, a material to be deposited can be chosen from a wider range. Further, the number of layers to be stacked can be set freely. Accordingly, a light-emitting device having a desired stacked-layer structure can be manufactured using a desired material.

By application of the present invention, a desired material can be deposited on the deposition target substrate without being wasted; therefore, use efficiency of a material is increased, and manufacturing cost can be reduced. Moreover, materials can be prevented from being attached to an inner wall of a deposition chamber, and thus maintenance of the deposition apparatus can be easier.

Further, in the present invention, laser light having a high output can be used as a light source, and thus deposition on a large area can be performed at a time. Thus, time taken for manufacturing a light-emitting device (takt time) can be reduced, which can lead to increase in productivity.

Further, in the present invention, since the thickness of a film to be deposited on the deposition target substrate can be controlled by controlling the thickness of the material layer formed over the deposition substrate, a thickness monitor is not needed at the time of deposition on the deposition target substrate. Therefore, a user does not have to adjust the deposition rate with a thickness monitor, and the deposition process can be fully automated. Accordingly, productivity can be increased.

In addition, application of the present invention makes it possible to uniformly deposit the material contained in the material layer which is formed over the deposition substrate. In the case where the material layer contains plural kinds of materials, a film containing the same materials at roughly the same weight ratio as the material layer can be deposited on the deposition target substrate. Therefore, in a deposition method of the present invention, when deposition is performed using plural kinds of materials having different vaporization temperatures, a desired layer containing different kinds of materials can be deposited easily with high precision without complicated control of the evaporation rate or the like.

Further, in the case of manufacturing a light-emitting device using the deposition substrate described in Embodiment Mode 2, layers which contain the same material and have different thicknesses can be deposited in one deposition step. Accordingly, an optical design can be optimized in such a manner that layers which are used in common in light-emitting elements of each emission color are deposited so as to have different thicknesses without increasing the number of deposition steps. Therefore, performance of the light-emitting device (efficiency, color purity, or the like) can be improved.

Note that a structure described in this embodiment mode can be used in combination with any of the structures described in other embodiment modes, as appropriate.

Embodiment Mode 6

In this embodiment mode, a light-emitting device which is formed using the light-emitting element described in Embodiment Mode 5 will be described.

First, a passive-matrix light-emitting device will be described with reference to FIGS. 10A to 10C and FIG. 11.

In a passive-matrix (also called simple-matrix) light-emitting device, a plurality of anodes arranged in stripes (in stripe form) is provided to be perpendicular to a plurality of cathodes arranged in stripes. A light-emitting layer is interposed at each intersection. Therefore, a pixel at an intersection of an anode which is selected (to which a voltage is applied) and a cathode which is selected emits light.

FIG. 10A illustrates a top view of a pixel portion before sealing. FIG. 10B illustrates a cross-sectional view taken along a dashed line A-A' in FIG. 10A. FIG. 10C illustrates a cross-sectional view taken along a dashed line B-B'.

Over a substrate 1001, an insulating layer 1004 is formed as a base insulating layer. Note that the base insulating layer is not necessarily provided if not necessary. A plurality of first electrodes 1013 are arranged in stripes at regular intervals over the insulating layer 1004. A partition wall 1014 having openings each corresponding to a pixel is provided over the first electrodes 1013. The partition wall 1014 having openings is formed using an insulating material (a photosensitive or nonphotosensitive organic material (polyimide, acrylic, polyamide, polyimide amide, or benzocyclobutene) or an SOG film (such as a $SiO_x$ film including an alkyl group)). Note that each opening corresponding to a pixel is a light-emitting region 1021.

Over the partition wall 1014 having openings, a plurality of inversely tapered partition walls 1022 which are parallel to each other are provided to intersect with the first electrodes 1013. The inversely tapered partition walls 1022 are formed by a photolithography method using a positive-type photosensitive resin, of which portion unexposed to light remains as a pattern, in which the amount of light exposure or the length of development time is adjusted so that a lower portion of a pattern is etched more.

The total thickness of the partition wall 1014 having openings and the inversely tapered partition wall 1022 is set to be larger than the total thickness of an EL layer and a second electrode 1016. Thus, an EL layer which is divided into plural regions, specifically, an EL layer (R) (1015R) formed using a material which exhibits red light emission, an EL layer (G) (1015G) formed using a material which exhibits green light emission, and an EL layer (B) (1015B) formed using a material which exhibits blue light emission; and the second electrode 1016 are formed. Note that the plurality of separated regions are electrically isolated from each other.

The second electrodes 1016 are electrodes in stripes which are parallel to each other and extended along a direction intersecting with the first electrodes 1013. Note that the EL layer and a part of a conductive layer forming the second electrode 1016 are also formed over the inversely tapered partition walls 1022; however, they are separated from the EL layer (R) (1015R), the EL layer (G) (1015G), the EL layer (B)(1015B), and the second electrodes 1016. Note that the EL layer in this embodiment mode is a layer including at least a light-emitting layer and may include a hole-injecting layer, a hole-transporting layer, an electron-transporting layer, an electron-injecting layer, or the like in addition to the light-emitting layer.

Here, an example is described in which the EL layer (R) (1015R), the EL layer (G) (1015G), and the EL layer (B) (1015B) are selectively formed to form a light-emitting device which provides three kinds of light emission (red (R), green (G), blue (B)) and is capable of performing full color display. The EL layer (R) (1015R), the EL layer (G) (1015G), and the EL layer (B) (1015B) are formed into stripes parallel to each other. These EL layers may be formed by the deposition method described in Embodiment Modes 1 and 2.

Furthermore, if necessary, sealing is performed using a sealant such as a sealant can or a glass substrate for sealing. Here, a glass substrate is used as a sealing substrate, and a substrate and the sealing substrate are attached to each other with an adhesive material such as a sealant to seal a space surrounded by the adhesive material such as a sealant. The space that is sealed is filled with a filler or a dry inert gas. In addition, a desiccant or the like may be put between the substrate and the sealant so that reliability of the light-emitting device is increased. A small amount of moisture is removed by the desiccant, whereby sufficient drying is performed. The desiccant may be a substance which absorbs moisture by chemical adsorption, such as oxide of an alkaline earth metal as typified by calcium oxide or barium oxide. Note that a substance which adsorbs moisture by physical adsorption such as zeolite or silica gel may alternatively be used.

Note that, if the sealant is provided covering and in contact with the light-emitting element to sufficiently block the outside air, the desiccant is not necessarily provided.

Figure 11:
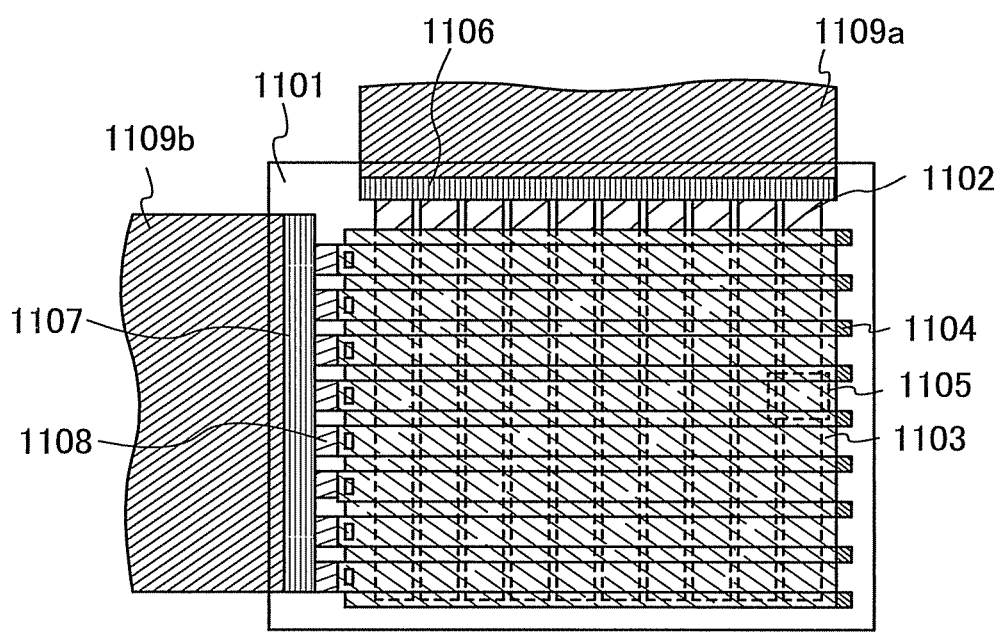
FIG. 11 is a view illustrating a passive matrix light-emitting device.

Next, FIG. 11 illustrates a top view of the case in which the passive-matrix light-emitting device in FIGS. 10A to 10C is mounted with an FPC or the like.

In FIG. 11, scan lines and data lines intersect with each other perpendicularly in a pixel portion for displaying images.

Here, the first electrodes 1013 in FIGS. 10A to 10C correspond to scan lines in FIG. 11; the second electrodes 1016 correspond to data lines 1102; and the inversely tapered partition walls 1022 correspond to partition walls 1104. EL layers are sandwiched between the data lines 1102 and the scan lines 1103, and an intersection portion indicated by a region 1105 corresponds to one pixel.

Note that the scan line 1103 is electrically connected at the end to a connection wiring 1108, and the connection wiring 1108 is connected to an FPC 1109*b* through an input terminal 1107. The data line 1102 is connected to an FPC 1109*a* through an input terminal 1106.

If necessary, a polarizing plate, a circularly polarizing plate (including an elliptically polarizing plate), a retardation plate (a quarter-wave plate or a half-wave plate), or an optical film such as a color filter may be provided as appropriate over a light-emitting surface. Further, the polarizing plate or the circularly polarizing plate may be provided with an anti-reflection film. For example, anti-glare treatment may be carried out by which reflected light can be diffused by surface roughness so as to reduce glare.

Although FIG. 11 illustrates the example in which a driver circuit is not provided over the substrate, the present invention is not particularly limited to this example. An IC chip including a driver circuit may be mounted on the substrate.

In the case where an IC chip is mounted, a data line side IC and a scan line side IC, in each of which a driver circuit for transmitting signals to the pixel portion is formed, are mounted on the periphery of (outside of) the pixel portion by a COG method. The mounting may be performed using a TCP or a wire bonding method other than a COG method. A TCP is a TAB tape mounted with an IC, and the TAB tape is connected to a wiring over an element-forming substrate for mounting the IC. Each of the data line side IC and the scan line side IC may be formed using a silicon substrate. Alternatively, a driver circuit may be formed using TFTs over a glass substrate, a quartz substrate, or a plastic substrate. Although described here is an example in which a single IC is provided on one side, a plurality of ICs may be provided on one side.

Figure 12A:
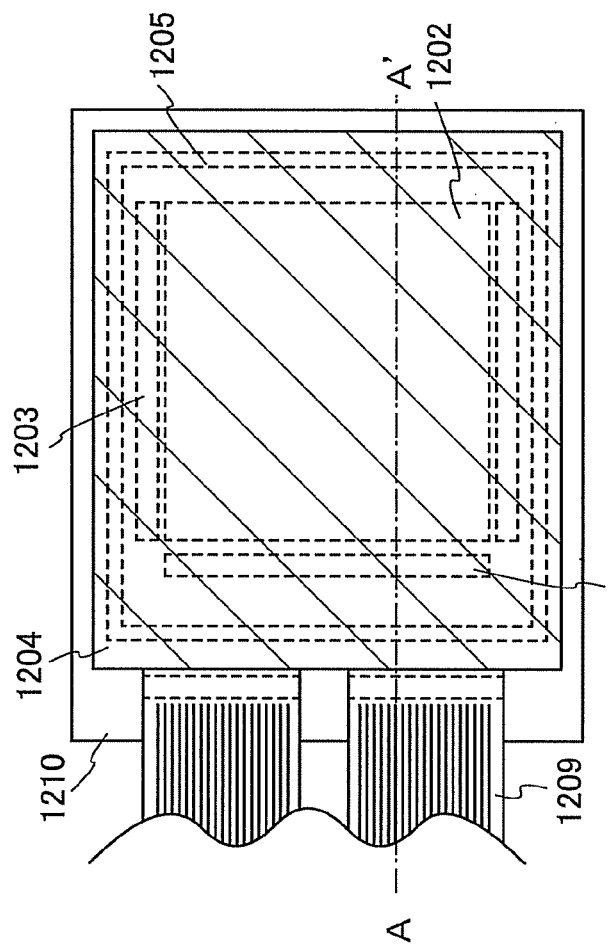
FIGS. 12A and 12B are views illustrating an active matrix light-emitting device.
Figure 12B:
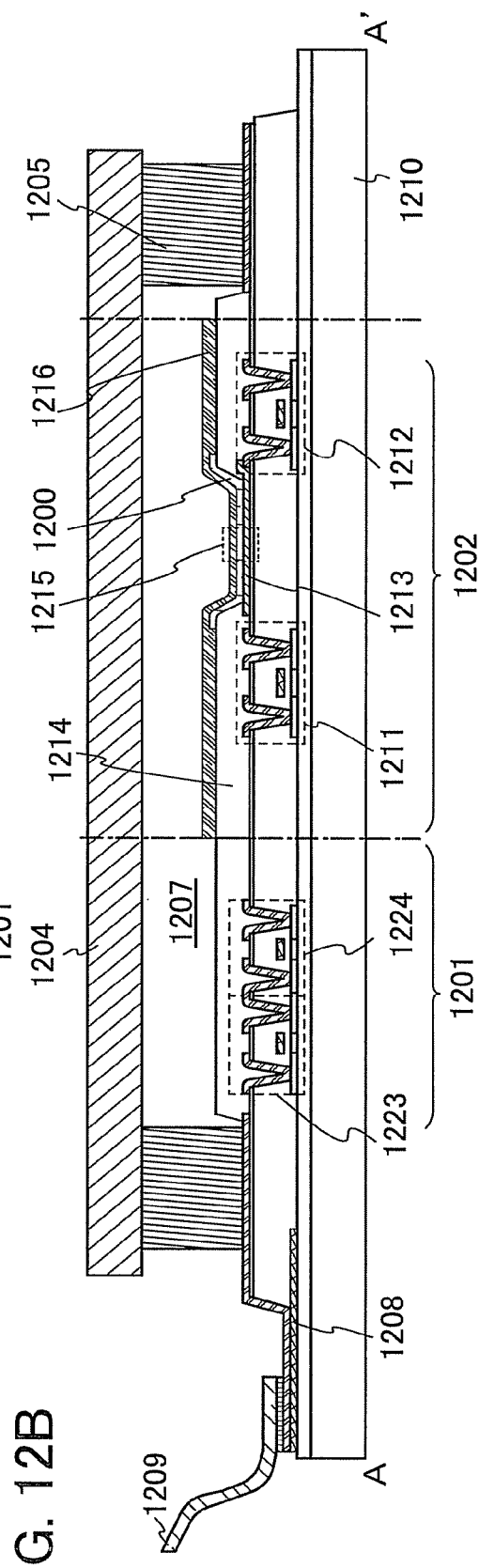

Next, an example of an active-matrix light-emitting device is described with reference to FIGS. 12A and 12B. Note that FIG. 12A is a top view showing a light-emitting device and FIG. 12B is a cross-sectional view taken along a dashed line A-A' in FIG. 12A. The active-matrix light-emitting device of this embodiment mode includes a pixel portion 1202 provided over an element substrate 1210, a driver circuit portion (a source-side driver circuit) 1201, and a driver circuit portion (a gate-side driver circuit) 1203. The pixel portion 1202, the driver circuit portion 1201, and the driver circuit portion 1203 are sealed, with a sealant 1205, between the element substrate 1210 and a sealing substrate 1204.

In addition, over the element substrate 1210, a lead wiring 1208 for connecting an external input terminal, through which a signal (e.g., a video signal, a clock signal, a start signal, a reset signal, or the like) or an electric potential is transmitted to the driver circuit portion 1201 and the driver circuit portion 1203 is provided. Here, an example is described in which a flexible printed circuit (FPC) 1209 is provided as the external input terminal. Note that only the FPC is illustrated here; however, the FPC may be provided with a printed wiring board (PWB). The light-emitting device in this specification includes not only the light-emitting device itself, but also the light-emitting device with an FPC or a PWB attached thereto.

Then, a cross-sectional structure is described with reference to FIG. 12B. While the driver circuit portion and the pixel portion are provided over an element substrate 1210, FIG. 12B only illustrates the driver circuit portion 1201, which is the source side driver circuit, and the pixel portion 1202.

An example is illustrated in which a CMOS circuit which is a combination of an n-channel TFT 1223 and a p-channel TFT 1224 is formed as the driver circuit portion 1201. Note that a circuit included in the driver circuit portion may be formed using various CMOS circuits, PMOS circuits, or NMOS circuits. In this embodiment mode, a driver-integrated type in which a driver circuit is formed over a substrate where a pixel portion is formed is described; however, it is not necessarily required to have such a structure, and a driver circuit can be formed not over but outside the substrate where a pixel portion is formed.

The pixel portion 1202 includes a plurality of pixels, each of which includes a switching TFT 1211, a current-controlling TFT 1212, and a first electrode 1213 which is electrically connected to a wiring (a source electrode or a drain electrode) of the current-controlling TFT 1212. Note that an insulator 1214 is formed covering an end portion of the first electrode 1213. In this embodiment mode, the insulator 1214 is formed using a positive photosensitive acrylic resin.

The insulator 1214 is preferably formed so as to have a curved surface with curvature at an upper end portion or a lower end portion in order to obtain favorable coverage by a film which is to be stacked over the insulator 1214. For example, in the case of using a positive photosensitive acrylic resin as a material for the insulator 1214, the insulator 1214 is preferably formed so as to have a curved surface with a curvature radius (0.2 μm to 3 μm) at the upper end portion thereof. Note that either a negative photosensitive material which becomes insoluble in an etchant by light irradiation or a positive photosensitive material which becomes soluble in an etchant by light irradiation can be used for the insulator 1214. As the insulator 1214, without limitation to an organic compound, either an organic compound or an inorganic compound such as silicon oxide or silicon oxynitride can be used.

An EL layer 1200 and a second electrode 1216 are stacked over the first electrode 1213. Note that when an ITO film is used as the first electrode 1213, and a stacked-layer film of a titanium nitride film and a film containing aluminum as its main component or a stacked-layer film of a titanium nitride film, a film containing aluminum as its main component, and a titanium nitride film is used as the wiring of the current-controlling TFT 1212 which is connected to the first electrode 1213, resistance of the wiring is low and favorable ohmic contact with the ITO film can be obtained. Note that, although not illustrated, the second electrode 1216 is electrically connected to the FPC 1209, which is an external input terminal.

In the EL layer 1200, at least the light-emitting layer is provided, and in addition to the light-emitting layer, a hole-injecting layer, a hole-transporting layer, an electron-transporting layer, or an electron-injecting layer is provided as appropriate. The first electrode 1213, the EL layer 1200, and the second electrode 1216 are stacked, whereby a light-emitting element 1215 is formed.

Although the cross-sectional view in FIG. 12B illustrates only one light-emitting element 1215, a plurality of light-emitting elements are arranged in matrix in the pixel portion 1202. Light-emitting elements which provide three kinds of light emissions (R, G, and B) are formed in the pixel portion 1202, whereby a light-emitting device capable of full color display can be formed. Alternatively, a light-emitting device capable of full color display may be formed by a combination with color filters.

Furthermore, the sealing substrate 1204 and the element substrate 1210 are attached to each other with the sealant 1205, whereby the light-emitting element 1215 is provided in a space 1207 surrounded by the element substrate 1210, the sealing substrate 1204, and the sealant 1205. Note that the space 1207 may be filled with the sealant 1205 or with an inert gas (such as nitrogen or argon).

Note that an epoxy-based resin is preferably used as the sealant 1205. It is preferable that such a material transmit as little moisture and oxygen as possible. As the sealing substrate 1204, a plastic substrate formed using fiberglass-reinforced plastics (FRP), polyvinyl fluoride (PVF), polyester, acrylic, or the like can be used besides a glass substrate or a quartz substrate.

As described above, a light-emitting device can be obtained by applying the present invention. Since TFTs are manufactured, an active-matrix light-emitting device tends to require higher manufacturing cost per device than a passive-matrix light-emitting device; however, application of the present invention makes it possible to reduce manufacturing cost of a light-emitting device.

By applying the present invention, formation of an EL layer forming a light-emitting element as well as manufacture of a light-emitting device including the light-emitting element can be facilitated.

Further, by application of the present invention, a flat even film can be deposited; therefore, a light-emitting device with excellent performance can be manufactured with high productivity.

Furthermore, by application of the present invention, a minute pattern can be formed and deformation which is pattern deposition except a desired pattern can be suppressed; therefore, a high-definition light-emitting device can be manufactured.

In the present invention, unlike the case where the EL layer is formed by a wet process, it is not necessary to take into consideration solubility of the layer which has been formed, or the like; therefore, a material to be deposited can be chosen from a wider range. Further, the number of layers to be stacked can be set freely. Accordingly, a light-emitting device having a desired stacked-layer structure can be manufactured using a desired material.

By application of the present invention, a desired material can be deposited on the deposition target substrate without being wasted; therefore, use efficiency of a material is increased, and manufacturing cost can be reduced. Moreover, materials can be prevented from being attached to an inner wall of a deposition chamber, and thus maintenance of the deposition apparatus can be easier.

Further, in the present invention, laser light having a high output can be used as a light source, and thus deposition on a large area can be performed at a time. Thus, time taken for manufacturing the light-emitting device (takt time) can be reduced, which can lead to increase in productivity.

Further, in the present invention, since the thickness of a film to be deposited on the deposition target substrate can be controlled by controlling the thickness of the material layer formed over the deposition substrate, a thickness monitor is not needed at the time of deposition on the deposition target substrate. Therefore, a user does not have to adjust the deposition rate with a thickness monitor, and the deposition process can be fully automated. Accordingly, productivity can be increased.

In addition, application of the present invention makes it possible to uniformly deposit the material contained in the material layer which is formed over the deposition substrate. In the case where the material layer contains plural kinds of materials, a film containing the same materials at roughly the same weight ratio as the material layer can be deposited on the deposition target substrate. Therefore, in a deposition method of the present invention, when deposition is performed using plural kinds of materials having different vaporization temperatures, a desired layer containing different kinds of materials can be deposited easily with high precision without complicated control of the evaporation rate or the like.

Further, in the case of manufacturing a light-emitting device using the deposition substrate described in Embodiment Mode 2, layers which contain the same material and have different thicknesses can be deposited in one deposition step. Accordingly, an optical design can be optimized in such a manner that layers which are used in common in light-emitting elements of each emission color are deposited so as to have different thicknesses without increasing the number of deposition steps. Therefore, performance of the light-emitting device (efficiency, color purity, or the like) can be improved.

Note that a structure described in this embodiment mode can be used in combination with any of the structures described in other embodiment modes, as appropriate.

Embodiment Mode 7

In this embodiment mode, various electronic devices completed using the light-emitting device manufactured according to the present invention will be described with reference to FIGS. 13A to 13E.

Examples of electronic devices manufactured using the light-emitting device according to the present invention include a television, a camera such as a video camera or a digital camera, a goggle type display (head mounted display), a navigation system, an audio reproducing device (such as a car audio and an audio component), a notebook computer, a game machine, a portable information terminal (such as a mobile computer, a cellular phone, a portable game machine, and an electronic book reader), an image reproducing device provided with a recording medium (specifically, a device for reproducing a recording medium such as a digital video disc (DVD) and having a display device for displaying the reproduced image), a lighting device, and the like. Specific examples of these electronic devices are illustrated in FIGS. 13A to 13E.

Figure 13A:
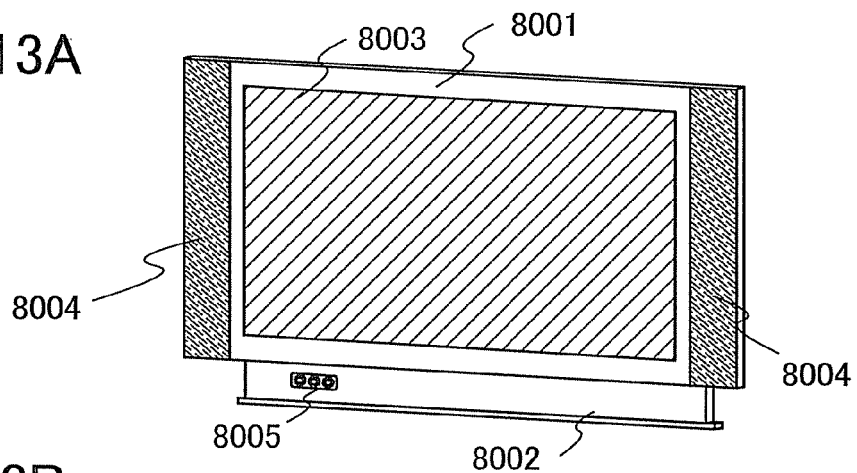
FIGS. 13A to 13E are views each illustrating an electronic device.

FIG. 13A illustrates a display device, which includes a chassis 8001, a support 8002, a display portion 8003, a speaker portion 8004, a video input terminal 8005, and the like. This display device is manufactured using a light-emitting device which is formed according to the present invention in the display portion 8003. Note that the display device includes all devices for displaying information in its category, such as for a computer, for receiving TV broadcasting, and for displaying an advertisement. According to the present invention, use efficiency of a material and manufacturing efficiency can be improved mainly in a deposition process of a light-emitting device and performance of the light-emitting device can also be improved. Accordingly, manufacturing cost can be reduced and productivity can be increased in manufacturing a display device; thus, an inexpensive display device can be provided.

Figure 13B:
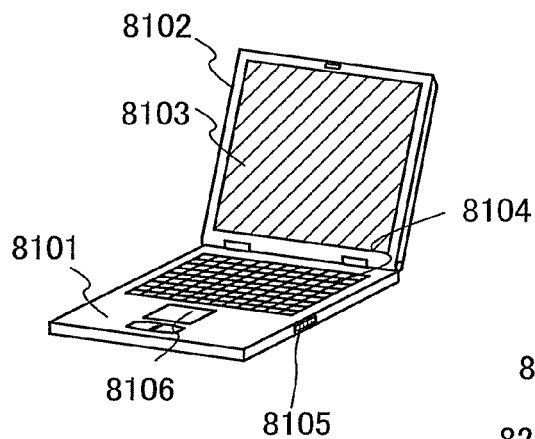

FIG. 13B illustrates a computer which includes a main body 8101, a chassis 8102, a display portion 8103, a keyboard 8104, an external connecting port 8105, a pointing device 8106, and the like. This computer is manufactured using a light-emitting device which is formed according to the present invention in the display portion 8103. According to the present invention, use efficiency of a material and manufacturing efficiency can be improved mainly in a deposition process of a light-emitting device can be improved and performance of the light-emitting device can also be improved. Accordingly, manufacturing cost can be reduced and productivity can be increased in manufacturing a computer; thus, an inexpensive computer can be provided.

Figure 13C:
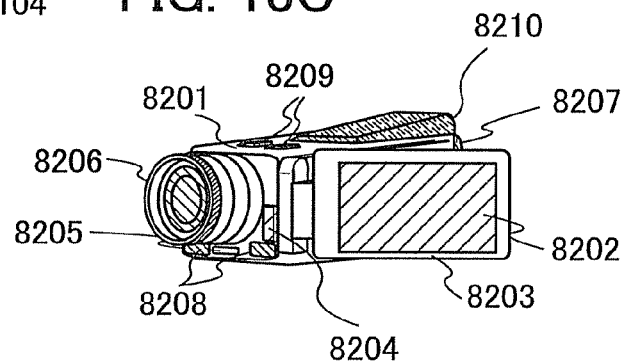

FIG. 13C illustrates a video camera which includes a main body 8201, a display portion 8202, a chassis 8203, an external connecting port 8204, a remote control receiving portion 8205, an image receiving portion 8206, a battery 8207, an audio input portion 8208, an operation key 8209, an eye piece portion 8210, and the like. This video camera is manufactured using a light-emitting device which is formed according to the present invention in the display portion 8202. According to the present invention, use efficiency of a material and manufacturing efficiency can be improved mainly in a deposition process of a light-emitting device and performance of the light-emitting device can also be improved. Accordingly, manufacturing cost can be reduced and productivity can be increased in manufacturing a video camera; thus, an inexpensive video camera can be provided.

Figure 13D:
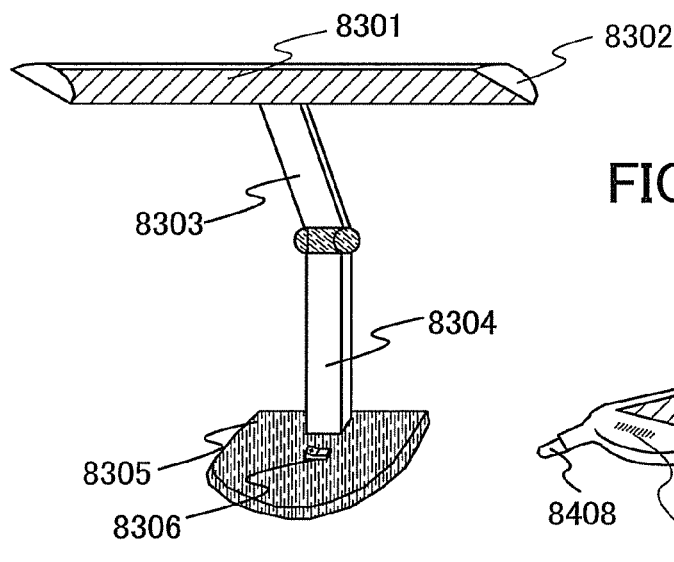

FIG. 13D illustrates a desk lamp which includes a lighting portion 8301, a shade 8302, an adjustable arm 8303, a support 8304, a base 8305, and a power supply switch 8306. This desk lamp is manufactured using a light-emitting device which is formed according to the present invention in the lighting portion 8301. Note that a lamp includes a ceiling light, a wall light, and the like in its category. According to the present invention, use efficiency of a material and manufacturing efficiency can be improved mainly in a deposition process of a light-emitting device and performance of the light-emitting device can also be improved. Accordingly, manufacturing cost can be reduced and productivity can be increased in manufacturing a desk lamp; thus, an inexpensive desk lamp can be provided.

Figure 13E:
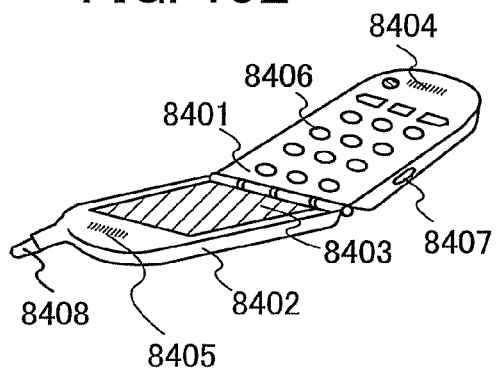

FIG. 13E illustrates a cellular phone which includes a main body 8401, a chassis 8402, a display portion 8403, an audio input portion 8404, an audio output power portion 8405, an operation key 8406, an external connecting port 8407, an antenna 8408, and the like. This cellular phone is manufactured using a light-emitting device which is formed according to the present invention in the display portion 8403. According to the present invention, use efficiency of a material and manufacturing efficiency can be improved mainly in a deposition process of a light-emitting device and performance of the light-emitting device can also be improved. Accordingly, manufacturing cost can be reduced and productivity can be increased in manufacturing a cellular phone; thus, an inexpensive cellular phone can be provided.

Figure 14A:
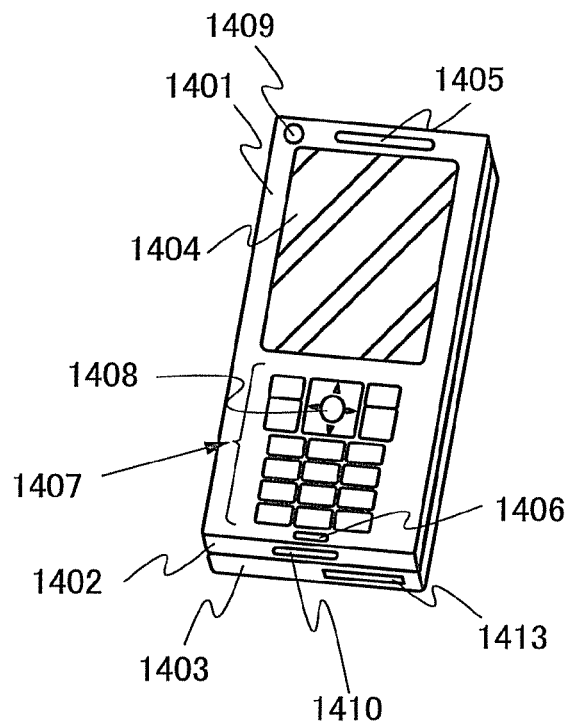
FIGS. 14A to 14C are views illustrating an electronic device.
Figure 14B:
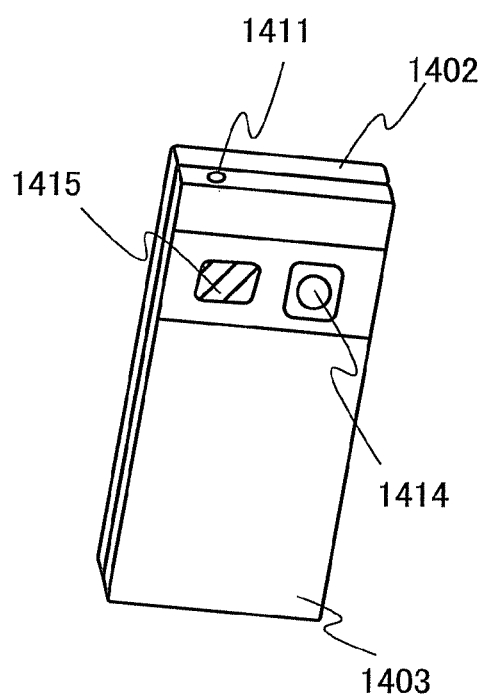
Figure 14C:
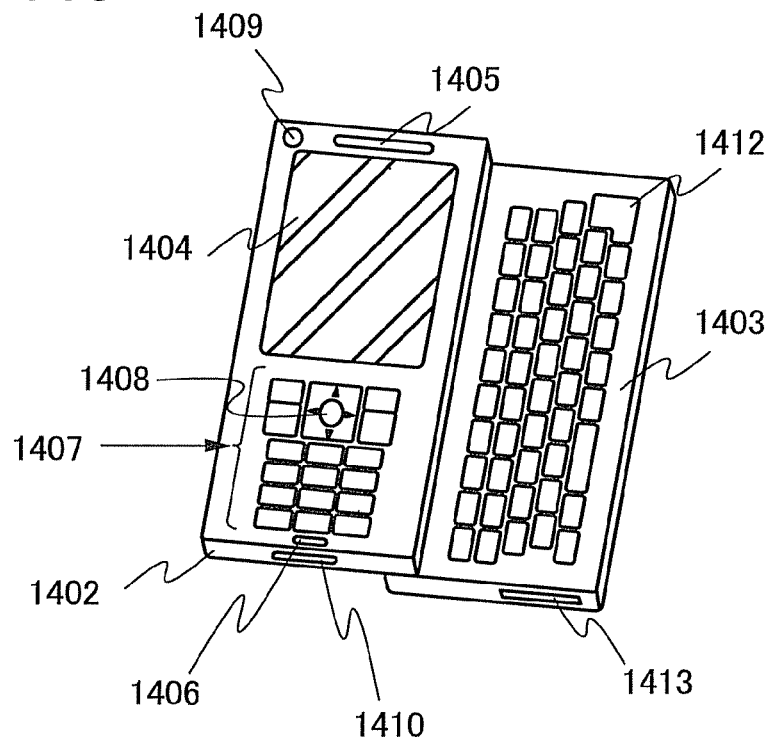

FIGS. 14A to 14C also illustrate a cellular phone and FIG. 14A is a front view, FIG. 14B is a rear view, and FIG. 14C is a development view. A main body 1401 is a so-called smartphone which has both functions of a cellular phone and a portable information terminal, and incorporates a computer and can process a variety of data processing in addition to voice calls.

The main body 1401 has two chassis: a chassis 1402 and a chassis 1403. The chassis 1402 includes a display portion 1404, a speaker 1405, a microphone 1406, operation keys 1407, a pointing device 1408, a camera lens 1409, an external connection terminal 1410, an earphone terminal 1411, and the like, while the chassis 1403 includes a keyboard 1412, an external memory slot 1413, a camera lens 1414, a light 1415, and the like. In addition, an antenna is incorporated in the chassis 1402.

Further, in addition to the above-described structure, the smartphone may incorporate a non-contact IC chip, a small size memory device, or the like.

The light-emitting device described in the above embodiment modes can be incorporated in the display portion 1404, and a display orientation can be changed as appropriate according to a usage pattern. Because the camera lens 1409 is provided in the same plane as the display portion 1404, the smartphone can be used as a videophone. Further, a still image and a moving image can be taken with the camera lens 1414 and the light 1415 using the display portion 1404 as a viewfinder. The speaker 1405 and the microphone 1406 can be used for video calling, recording and playing sound, and the like without being limited to voice calls.

With operation keys 1407, making and receiving calls, inputting simple information such as e-mails or the like, scrolling the screen, moving the cursor, and the like are possible. Furthermore, the chassis 1402 and the chassis 1403 (FIG. 14A), which are overlapped with each other, are slid to expose the chassis 1403 as illustrated in FIG. 14C, and can be used as a portable information terminal. At this time, smooth operation can be conducted using the keyboard 1412 and the pointing device 1408. The external connection terminal 1410 can be connected to an AC adaptor and various types of cables such as a USB cable, and charging, data communication with a computer, or the like are possible. Furthermore, a large amount of data can be stored and moved by inserting a recording medium into the external memory slot 1413.

In addition to the above described functions, the smartphone may have an infrared communication function, a television receiver function, and the like.

Note that this cellular phone is manufactured using a light-emitting device which is formed according to the present invention in the display portion 1404. According to the present invention, use efficiency of a material and manufacturing efficiency can be improved mainly in a deposition process of a light-emitting device and performance of the light-emitting device can also be improved. Accordingly, manufacturing cost can be reduced and productivity can be increased in manufacturing a cellular phone; thus, an inexpensive cellular phone can be provided.

As described above, an electronic device or a lighting device can be obtained by using the light-emitting device according to the present invention. The range of application of the light-emitting device according to the present invention is so wide that the light-emitting device can be applied to electronic devices of various fields.

Note that a structure described in this embodiment mode can be used in combination with any of the structures described in other embodiment modes, as appropriate.

Embodiment 1

Figure 15A:
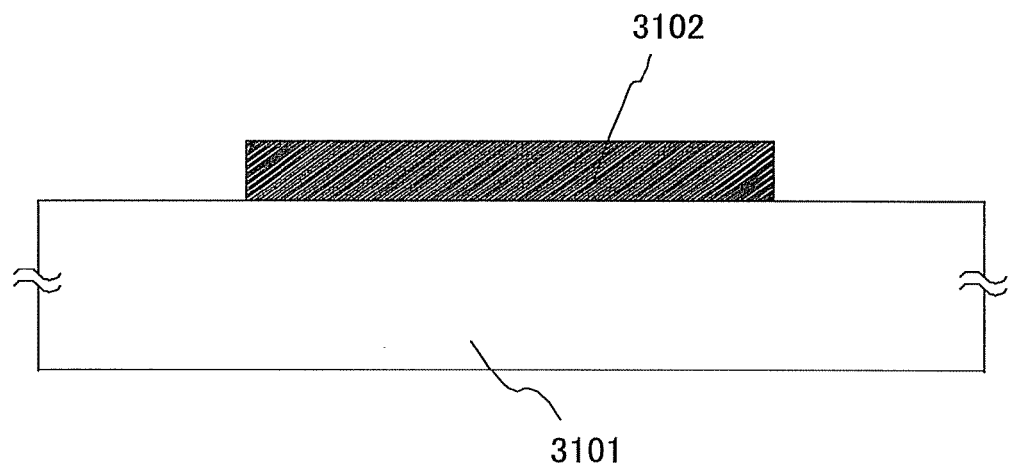
FIGS. 15A and 15B are views illustrating Embodiment 1.
Figure 16A:
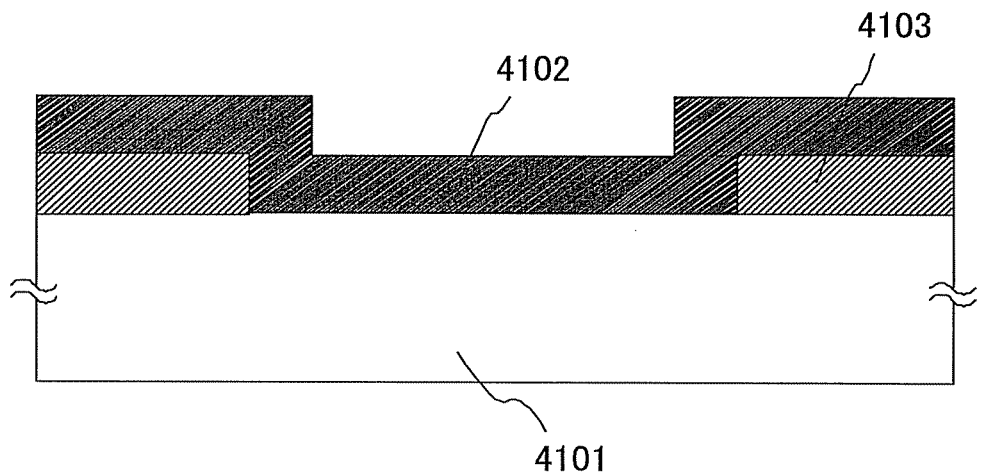
FIGS. 16A and 16B are views illustrating Embodiment 1.

In this embodiment, calculations were performed for a heat distribution when a deposition substrate used in a deposition method of the present invention is irradiated with laser light. Models used for the calculations are illustrated in FIG. 15A and FIG. 16A. Note that the calculations were performed for two-dimensional models.

The model illustrated in FIG. 15A is a deposition substrate used in a deposition method of the present invention. A two-dimensional model was used in which a light absorption layer 3102 (in which a titanium film with a thickness of 100 nm is stacked over a titanium nitride film with a thickness of 100 nm) is formed over a glass substrate (with a thickness of 0.7 mm). Note that the width of the light absorption layer was set to be 21.5 μm.

The model illustrated in FIG. 16A is a reference deposition substrate used for comparison. A two-dimensional model was used in which aluminum (Al) which has a thickness of 200 nm and serves as a reflective layer 4103 and titanium (Ti) with a thickness of 200 nm which serves as a light absorption layer 4102 are stacked over a glass substrate 4101 (with a thickness of 0.7 mm). Note that a width of an opening of the reflective layer was set to be 21.5 μm.

The calculation conditions are as follows:
Calculation tool: ANSYS
Mesh to be used: 3-node triangle free mesh, Minimum mesh length: 0.05 μm
The use of Nonlinear analysis (Newton's method) due to dependence of thermal conduction characteristics on temperature.
Tolerance for nonlinear convergence: L2 norm, less than or equal to $1.0\ e^{-4}$
Movement speed of substrate: 1000 mm/sec
Laser power: 12 W
Size of laser spot: 10 μm×1000 μm
Light absorptance of light absorption layer: 64.9%
Time interval in nonstationary analysis: 0.125 μs In the case where a thin film formed using the glass (with a thickness of 0.7 mm) and Ti (with a thickness of 200 nm) is irradiated with laser light having a wavelength of 532 nm, a result of absorbing 64.96% of the laser energy was obtained by a MATRIX method which is one of optical calculation methods. If all of the absorbed laser energy is converted into a calorific value, the following equation is obtained:

Calorific value per unit time=(laser energy per unit time)×0.6496

The calorific value was distributed uniformly in the volume over a region of titanium generating heat by laser irradiation. Table 1 shows the parameters used for the calculation. The initial temperature was 27° C., which was uniform, and the boundary conditions were all thermal insulation conditions. For calculation convergence, the lowest point of the glass substrate was fixed to 27° C.

TABLE 1

| Al | | | | | |
|---|---|---|---|---|---|
| Temperature [° C.] | 25.15 | 127 | 227 | 327 | 527 |
| Specific heat [J/gK] | 0.5227 | 0.5542 | 0.5733 | 0.5904 | 0.632 |
| Temperature [° C.] | | | 27 | 127 | 427 |
| Thermal conductivity [J/smK] | | | 21.9 | 20.4 | 19.4 |
| Temperature [° C.] | | | 27 | | 2000 |
| Density [g/m³] | | | 4.51E+06 | | 4.51E+06 |

| Ti (TiN) | | | | | | |
|---|---|---|---|---|---|---|
| Temperature [° C.] | 25.15 | 127 | 227 | 327 | 527 | 727 |
| Specific heat [J/gK] | 0.5993 | 0.7081 | 0.7606 | 0.7875 | 0.8182 | 0.8429 |
| Temperature [° C.] | | 25 | 127 | 200 | 650 | 1000 |
| Thermal conductivity [J/smK] | | 8.84 | 28.83 | 16.72 | 11.29 | 8.36 |
| Temperature [° C.] | | | 27 | | 2000 | |
| Density [g/m³] | | | 5.43E+06 | | 5.43E+06 | |

Figure 15B:
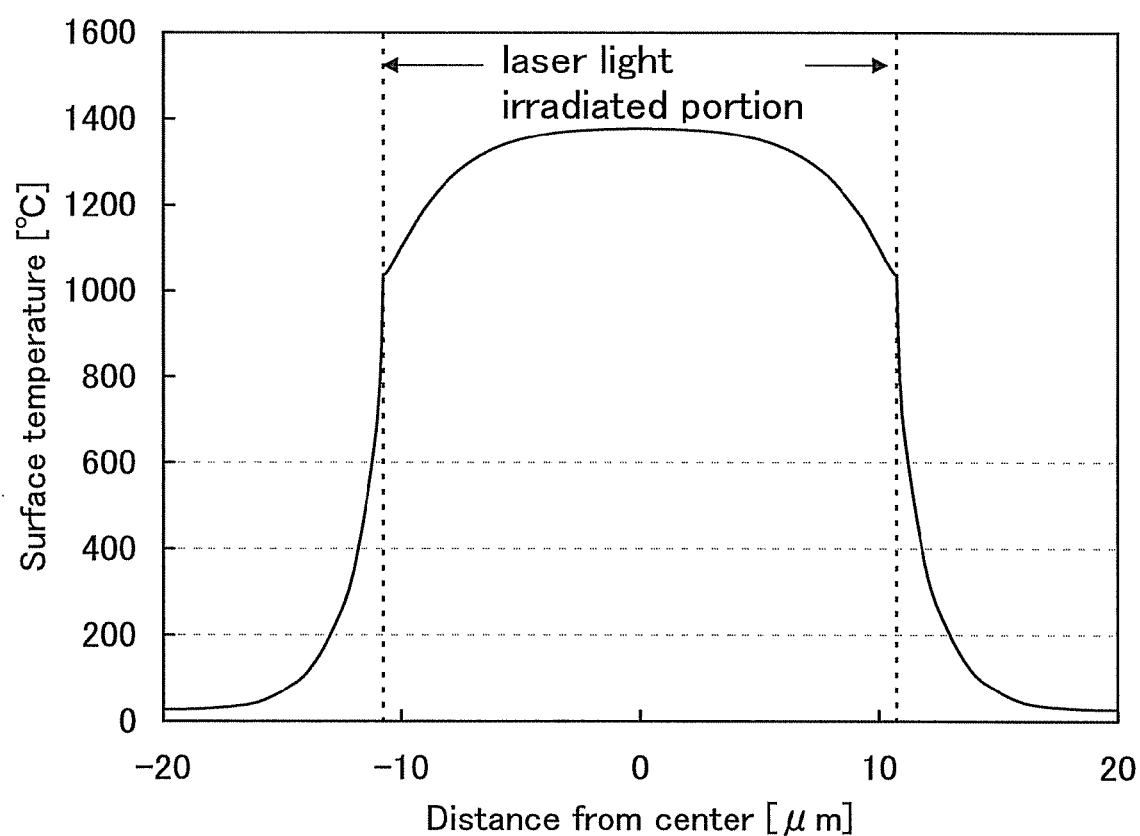
Figure 16B:
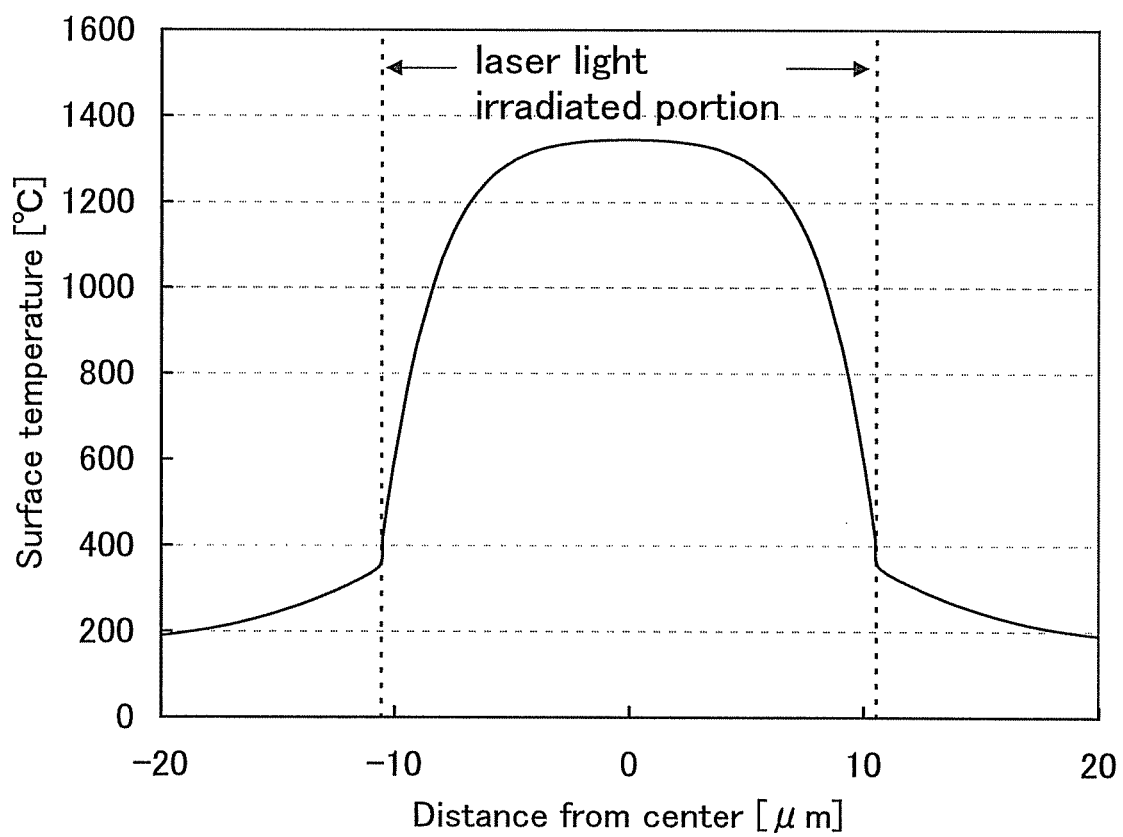

FIG. 15B and FIG. 16B shows the calculation results. Surface temperatures at the termination of laser irradiation (irradiation time: 10 ns) are shown in FIG. 15B and FIG. 16B. Note that, unlike a three-dimensional model, a two-dimensional model is a model in which heat is not diffused in a direction perpendicular to a paper surface; therefore, the surface temperature of the two-dimensional model tends to be calculated at a higher temperature than an actual temperature thereof.

The model illustrated in FIG. 15A which is not provided with a reflective layer has a smaller temperature gradient region of the low temperature and a larger high temperature region in the light absorption layer than the comparative model illustrated in FIG. 16A. Although heat is diffused in a horizontal direction (a surface direction) in the comparative model illustrated in FIG. 16A, the model illustrated in FIG. 15A has a structure in which heat is blocked and stored in the light absorption layer. Accordingly, the temperature gradient in the light absorption layer is small and a temperature difference between the light absorption layer and the outside is significant. That is, since a temperature difference between a transfer portion where the light absorption layer is formed and a nontransfer portion where the light absorption layer is not formed is significant, it can be thought that deformation of a deposition pattern is suppressed as compared to the comparative model. Therefore, according to the present invention, a higher-definition light-emitting device can be manufactured.

This application is based on Japanese Patent Application serial No. 2008-051256 filed with Japan Patent Office on Feb. 29, 2008, the entire contents of which are hereby incorporated by reference.

EXPLANATION OF REFERENCE

101: first substrate
102: light absorption layer
102A: light absorption layer
102B: light absorption layer
102C: light absorption layer
103: material layer
106: opening
107: second substrate
108: first electrode
109: insulator
110: light
111: EL layer
111A: EL layer
111B: EL layer
111C: EL layer
401: light absorption layer
402: opening
411: EL layer (R)
412: EL layer (G)
413: EL layer (B)
414: insulator
501: light absorption layer
511: EL layer (R)
512: EL layer (G)
513: EL layer (B)
604: light absorption layer
605: material layer
614: light absorption layer
615: material layer
624: light absorption layer
625: material layer
701: load chamber
702: common chamber
703: delivery chamber
704: sealing chamber
705: unload chamber
711: treatment chamber
712: treatment chamber
713: treatment chamber
714: treatment chamber
715: treatment chamber
716: treatment chamber
717: treatment chamber
718: treatment chamber
720: transfer unit
721: transfer unit
730: gate valve
731: gate valve
733: gate valve
740: gate valve
741: gate valve
742: gate valve
801: second substrate
803: laser device
804: first optical system
805: second optical system
806: third optical system
807: reflecting mirror
808: imaging element
812: positional alignment marker
814: light absorption layer
815: material layer
816: control device
820: window
821: first electrode
822: partition wall
823: hole-injecting layer
824: hole-transporting layer
825: light-emitting layer
826: light-emitting layer
827: light-emitting layer
832: first substrate
833: third substrate
834: fourth substrate
835: fifth substrate
836: sixth substrate
837: seventh substrate
838: eighth substrate
901: substrate
902: first electrode
903: EL layer
904: second electrode
911: hole-injecting layer
912: hole-transporting layer
913: light-emitting layer
914: electron-transporting layer
915: electron injecting layer
1001: substrate
1004: insulating layer
1013: first electrode
1014: partition wall
1016: second electrode
1021: light-emitting region
1022: partition wall
1102: data line
1103: scan line
1104: partition wall
1105: region
1106: input terminal
1107: input terminal
1108: connection wiring
1109a: FPC
1109b: FPC
1200: EL layer
1201: driver circuit portion (source-side driver circuit)
1202: pixel portion
1203: driver circuit portion (gate-side driver circuit),
1204: sealing substrate
1205: sealant
1207: space
1208: wiring
1209: FPC (flexible print circuit)
1210: element substrate
1211: a switching TFT 1212: current-controlling TFT
1213: first electrode
1214: insulator
1215: light-emitting element
1216: second electrode
1223: n-channel TFT
1224: p-channel TFT
1401: main body
1402: chassis
1403: chassis
1404: display portion
1405: speaker
1406: microphone
1407: operation key
1408: pointing device
1409: camera lens
1410: an external connection terminal
1411: an earphone terminal
1412: keyboard
1413: external memory slot
1414: camera lens
1415: light
3101: glass substrate
3102: light absorption layer
4101: glass substrate
4102: light absorption layer
4103: reflective layer
8001: chassis
8002: support
8003: display portion
8004: speaker portion
8005: video input terminal
8101: main body
8102: chassis
8103: display portion
8104: keyboard
8105: external connecting port
8106: pointing device
8201: main body
8202: display portion
8203: chassis
8204: external connecting port
8205: remote control receiving portion
8206: image receiving portion
8207: battery
8208: audio input portion
8209: operation key
8210: eye piece portion
8301: lighting portion
8302: shade
8303: adjustable arm
8304: support
8305: base
8306: power supply switch
8401: main body
8402: chassis
8403: display portion
8404: audio input portion
8405: audio output power portion
8406: operation key
8407: external connecting port
8408: antenna

The invention claimed is:

1. A deposition method comprising the steps of:
forming a plurality of light absorption layers over a first surface of a first substrate;
forming a material layer over the first surface of the first substrate so that the material layer covers the plurality of the light absorption layers;
making the first surface of the first substrate and a deposition target surface of a second substrate face each other; and
irradiating opposite to the first surface of the first substrate with a laser, whereby a part of the material layer is deposited on the deposition target surface of the second substrate,
wherein the part of the material layer overlaps and is in direct contact with the plurality of the light absorption layers,
wherein the part of the material layer is selectively heated by irradiating with the laser through the plurality of the light absorption layers, and
wherein different thicknesses of the material layer is deposited on the deposition target surface of the second substrate in one deposition step, without changing an intensity of the laser, by controlling each thickness of the plurality of light absorption layers.

2. The deposition method according to claim 1, wherein each of the plurality of the light absorption layers has a reflectance of less than or equal to 70% with respect to light.

3. The deposition method according to claim 1, wherein the each thickness of the plurality of the light absorption layers is greater than or equal to 10 nm and less than or equal to 600 nm.

4. The deposition method according to claim 1, wherein the material layer comprises an organic compound.

5. The deposition method according to claim 1, wherein each of the plurality of light absorption layers has an island shape, a rectangular shape, a stripe shape, or a hexagonal shape, and contains one of a metal nitride, metal, and carbon.

6. The deposition method according to claim 1,
wherein the laser has a repetition rate which is greater than or equal to 10 MHz and a pulse width which is greater than or equal to 100 fs and less than or equal to 10 ns,
wherein the first substrate is scanned with the laser, and
wherein the scanning with the laser is performed by moving the first substrate and the second substrate by a substrate moving means.

7. A deposition method comprising the steps of:
forming a light absorption layer over a first surface of a first substrate;
forming a material layer over the first surface of the first substrate so that the material layer covers the light absorption layer;
making the first surface of the first substrate and a deposition target surface of a second substrate face each other; and
irradiating opposite to the first surface of the first substrate with a laser, whereby a part of the material layer is deposited on the deposition target surface of the second substrate,
wherein the part of the material layer overlaps and is in direct contact with the light absorption layer,
wherein the part of the material layer is selectively heated by irradiating with the laser through the light absorption layer, and
wherein different thicknesses of the material layer is deposited on the deposition target surface of the second substrate in one deposition step, without changing an intensity of the laser, by controlling thicknesses of the light absorption layer.

8. The deposition method according to claim 7, wherein the light absorption layer has a reflectance of less than or equal to 70% with respect to light.

9. The deposition method according to claim 7, wherein the thicknesses of the light absorption layer is greater than or equal to 10 nm and less than or equal to 600 nm.

10. The deposition method according to claim 7, wherein the light absorption layer has an island shape, a rectangular shape, a stripe shape, or a hexagonal shape, and contains one of a metal nitride, metal, and carbon.

11. The deposition method according to claim 7, wherein the material layer is formed by a wet process.

12. The deposition method according to claim 7, wherein the material layer comprises an organic compound.

13. The deposition method according to claim 7, wherein a laser shape is linear or rectangular.

14. The deposition method according to claim 7,
wherein the laser has a repetition rate which is greater than or equal to 10 MHz and a pulse width which is greater than or equal to 100 fs and less than or equal to 10 ns,
wherein the first substrate is scanned with the laser, and
wherein the scanning with the laser is performed by moving the first substrate and the second substrate by a substrate moving means.

15. A method for manufacturing a light-emitting device comprising the steps of:
forming a plurality of light absorption layers over a first surface of a first substrate;
forming a material layer over the first surface of the first substrate so that the material layer covers the plurality of the light absorption layers;
forming an electrode over a second substrate;
making the first surface of the first substrate and a deposition target surface of the second substrate on the electrode face each other; and
irradiating opposite to the first surface of the first substrate with a laser, whereby a part of the material layer is deposited on the deposition target surface of the second substrate,
wherein the part of the material layer overlaps and is in direct contact with the plurality of the light absorption layers,
wherein the part of the material layer is selectively heated by irradiating with the laser through the plurality of the light absorption layers, and
wherein different thicknesses of the material layer is deposited on the deposition target surface of the second substrate in one deposition step, without changing an intensity of the laser, by controlling each thickness of the plurality of light absorption layers.

16. The method for manufacturing a light-emitting device according to claim 15, wherein each of the plurality of the light absorption layers has a reflectance of less than or equal to 70% with respect to light.

17. The method for manufacturing a light-emitting device according to claim 15, wherein the each thickness of the plurality of the light absorption layers is greater than or equal to 10 nm and less than or equal to 600 nm.

18. The method for manufacturing a light-emitting device according to claim 15, wherein the material layer comprises an organic compound.

19. The method for manufacturing a light-emitting device according to claim 15, wherein each of the plurality of light absorption layers has an island shape, a rectangular shape, a stripe shape, or a hexagonal shape, and contains any of metal nitride, metal, and carbon.

20. The method for manufacturing a light-emitting device according to claim 15, wherein the material layer contains either one or both of a light-emitting material and a carrier-transporting material.

21. The method for manufacturing a light-emitting device according to claim 15, wherein the electrode is an anode.

22. The method for manufacturing a light-emitting device according to claim 15,
wherein the laser has a repetition rate which is greater than or equal to 10 MHz and a pulse width which is greater than or equal to 100 fs and less than or equal to 10 ns,
wherein the first substrate is scanned with the laser, and
wherein the scanning with the laser is performed by moving the first substrate and the second substrate by a substrate moving means.

23. A method for manufacturing a light-emitting device comprising the steps of:
forming a light absorption layer over a first surface of a first substrate;
forming a material layer over the first surface of the first substrate so that the material layer covers the light absorption layer;
forming an electrode over a second substrate;
making the first surface of the first substrate and a deposition target surface of the second substrate on the electrode face each other; and
irradiating opposite to the first surface of the first substrate with a laser, whereby a part of the material layer is deposited on the deposition target surface of the second substrate,
wherein the part of the material layer overlaps and is in direct contact with the light absorption layer,
wherein the part of the material layer is selectively by irradiating with the laser through the light absorption layer, and
wherein different thicknesses of the material layer is deposited on the deposition target surface of the second substrate in one deposition step, without changing an intensity of the laser, by controlling thicknesses of the light absorption layer.

24. The method for manufacturing a light-emitting device according to claim 23, wherein the light absorption layer has a reflectance of less than or equal to 70% with respect to light.

25. The method for manufacturing a light-emitting device according to claim 23, wherein the thicknesses of the light absorption layer is greater than or equal to 10 nm and less than or equal to 600 nm.

26. The method for manufacturing a light-emitting device according to claim 23, wherein the light absorption layer has an island shape, a rectangular shape, a stripe shape, or a hexagonal shape, and contains one of a metal nitride, metal, and carbon.

27. The method for manufacturing a light-emitting device according to claim 23, wherein the material layer is formed by a wet process.

28. The method for manufacturing a light-emitting device according to claim 23, wherein the material layer comprises an organic compound.

29. The method for manufacturing a light-emitting device according to claim 23, wherein a laser shape is linear or rectangular.

30. The method for manufacturing a light-emitting device according to claim 23, wherein the material layer contains either one or both of a light-emitting material and a carrier-transporting material.

31. The method for manufacturing a light-emitting device according to claim 23, wherein the electrode is an anode.

32. The method for manufacturing a light-emitting device according to claim 23,
wherein the laser has a repetition rate which is greater than or equal to 10 MHz and a pulse width which is greater than or equal to 100 fs and less than or equal to 10 ns,
wherein the first substrate is scanned with the laser, and
wherein the scanning with the laser is performed by moving the first substrate and the second substrate by a substrate moving means.

* * * * *

UNITED STATES PATENT AND TRADEMARK OFFICE
CERTIFICATE OF CORRECTION

PATENT NO. : 8,581,234 B2  
APPLICATION NO. : 12/391785  
DATED : November 12, 2013  
INVENTOR(S) : Shunpei Yamazaki et al.

Page 1 of 1

It is certified that error appears in the above-identified patent and that said Letters Patent is hereby corrected as shown below:

In the Specification:

Column 5, line 21; Change "layer should" to --layer 103 should--.
Column 8, line 55; Change "layer which" to --layer 102 which--.
Column 22, line 46; Change "substrate in" to --substrate 838 in--.
Column 27, line 26; Change "(Pic))," to --(pic)),--.
Column 28, line 7; Change ")]-N[4-(" to --)]-N-[4-(--.
Column 28, line 8; Change "2-a mine" to --2-amine--.
Column 35, line 40; Change "lines in" to --lines 1103 in--.
Column 41, line 56; Change "substrate (with" to --substrate 3103 (with--.

In the Claims:

Column 46, line 8, Claim 1; Change "apart of" to --a part of--.
Column 46, line 21, Claim 1; Change "of light" to --of the light--.
Column 47, lines 4 to 5, Claim 9; Change "wherein the thicknesses" to --wherein thicknesses--.
Column 47, line 51, Claim 15; Change "of light" to --of the light--.
Column 47, line 66, Claim 19; Change "contains any of metal" to --contains one of a metal--.
Column 48, line 33, Claim 23; Change "selectively by" to --selectively heated by--.
Column 48, line 45, Claim 25; Change "wherein the thicknesses" to --wherein thicknesses--.

Signed and Sealed this
Eleventh Day of March, 2014

Michelle K. Lee
*Deputy Director of the United States Patent and Trademark Office*